United States Patent
Shibata et al.

(10) Patent No.: US 6,418,052 B1
(45) Date of Patent: Jul. 9, 2002

(54) NONVOLATILE SEMICONDUCTOR MEMORY EQUIPPED WITH DATA LATCH CIRCUITS FOR TRANSFERRING ONE-BIT DATA OR MULTI-BIT DATA

(75) Inventors: Noboru Shibata; Tomoharu Tanaka; Hiroto Nakai; Toshio Yamamura, all of Yokohama; Susumu Fujimura, Fujisawa, all of (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/976,826

(22) Filed: Oct. 12, 2001

Related U.S. Application Data

(63) Continuation of application No. 09/528,112, filed on Mar. 17, 2000, now Pat. No. 6,331,945, which is a continuation of application No. 09/323,455, filed on Jun. 1, 1999, now Pat. No. 6,122,193.

(30) Foreign Application Priority Data

Jun. 1, 1998 (JP) .......................... 10-151367

(51) Int. Cl.[7] ............................................. G11C 16/24
(52) U.S. Cl. ............................ 365/185.12; 365/185.13; 365/185.11; 365/185.09; 365/185.03; 365/185.17
(58) Field of Search ....................... 365/185.11, 185.12, 365/185.13, 185.03, 185.09, 185.17, 185.18, 185.22

(56) References Cited

U.S. PATENT DOCUMENTS

| | | | |
|---|---|---|---|
| 5,515,317 A | 5/1996 | Wells et al. ................. | 711/100 |
| 5,838,612 A | 11/1998 | Calligaro et al. ....... | 365/185.03 |
| 5,910,914 A | 6/1999 | Wang ..................... | 365/185.21 |
| 5,982,663 A | * 11/1999 | Park ....................... | 365/185.09 |
| 6,067,248 A | * 5/2000 | Yoo ........................ | 365/185.03 |
| 6,233,717 B1 | * 5/2001 | Choi ............................ | 714/805 |

FOREIGN PATENT DOCUMENTS

| | | | | |
|---|---|---|---|---|
| JP | 59-121696 | * | 7/1984 | .......... G11C/17/00 |
| JP | 11-31392 | * | 2/1999 | .......... G11C/16/02 |

* cited by examiner

Primary Examiner—Andrew Q. Tran
(74) Attorney, Agent, or Firm—Hogan & Hartson, L.L.P.

(57) ABSTRACT

Data latch circuits are provided corresponding to select memory cells from or into which read or program is executed. The data latch circuits are grouped by two into sets. When 2-bit data is read from or programmed into the select memory cells, one data latch circuit is selected by a select signal, and, when 1-bit data is read or programmed, the two data latch circuits in one set are selected by a select signal. Between one or two selected data latch circuits and a data input/output buffer, data is exchanged. By so doing, changeover between 2-level data and multi-level (4-level or more-level) data concerning program or read of data into or out the memory cells becomes possible.

21 Claims, 23 Drawing Sheets

US 6,418,052 B1

NONVOLATILE SEMICONDUCTOR MEMORY EQUIPPED WITH DATA LATCH CIRCUITS FOR TRANSFERRING ONE-BIT DATA OR MULTI-BIT DATA

This is a continuation of application Ser. No. 09/528,112 filed Mar. 17, 2000, now U.S. Pat. No. 6,331,945, which is a continuation of application Ser. No. 09/323,455 filed Jun. 1, 1999, now U.S. Pat. No. 6,122,193, which application is hereby incorporated by reference in its entirety.

BACKGROUND OF THE INVENTION

The present invention relates to a non-volatile semiconductor memory and, more particularly, a multi-level NAND EEPROM in which data of 2 bits (4-level) or more multi-bits can be stored.

EEPROM, which is one type of non-volatile semiconductor memory, comprises a floating gate electrode (charge storage layer) and a control gate electrode, and the data value stored in the respective memory cell thereof is determined depending on the charge amount in the floating gate electrode.

Normally, in one memory cell, 1-bit (2-level) data "0", "1" is stored, but there has recently been developed a multi-level NAND EEPROM which can store therein data of 2 bits (4-level) or more multi-bits can be stored in each memory cell thereof.

FIG. 1 shows the essential portion of a 4-level NAND type flash EEPROM.

Here, it is added that this EEPROM is disclosed in the specification of Japanese Patent Application No. 9-124493 (filed on May 14, 1997).

A memory cell array 1 comprises a plurality of memory cells disposed in the shape of a matrix. These memory cells are constituted in such a manner that the data therein can be electrically rewritten. Further, in the memory cell array 1, there are disposed a plurality of word lines (control gate electrodes), a plurality of bit lines and a source line connected in common to the sources of a plurality of (or all) memory cells.

Further, disposed close to the memory cell array 1 are a bit line control circuit 2 which controls the potential of the bit lines, etc. and a word line control circuit 6 which controls the potential of the word lines, etc.

The bit line control circuit 2 is provided, for instance, for outputting the data in memory cells in the memory cell array 1 to the outside of the chip via the bit line at the time of read, for detecting the state of memory cells in the memory cell array 1 at the time of verify, and for applying a program control voltage to memory cells in the memory cell array 1 at the time of program.

The bit line control circuit 2 includes a plurality of data latch circuits which can hold data corresponding to one page of the memory cell array 1; and, by performing a read operation a plurality of times, the data corresponding to one page can be held at the same time in a plurality of data latch circuits. At the time of read, a column decoder 3 selects the plurality of data latch circuits one by one successively, so that the data corresponding to one page held in the plurality of data latch circuits is outputted serially outward the chip from a data input/output terminal 5 via a data input/output buffer 4.

Further, at the time of program, the column decoder 3 selects the plurality of data latch circuits successively one by one, so that data corresponding to one page is serially inputted from the outside of the chip to the inside thereof and held in the plurality of data latch circuits in the bit line control circuit 2. The data corresponding to one page which is thus held in the plurality of data latch circuits is programmed at the same time into the plurality of memory cells in the memory cell array 1.

In case of an n-bit type memory, such processing operations as mentioned above are performed in n blocks at the same time.

The word line control circuit 6 selects one of the word lines in the memory cell array 1 and applies predetermined potentials corresponding to the read, program and erase modes to the one word line thus selected (selected word line) and the other word lines (non-selected word lines).

The memory cell array 1, the bit line control circuit 2, the column decoder 3, the data input/output buffer 4 and the word line control circuit 6 are controlled by a control signal and control voltage generation circuit 7.

In the 4-level NAND flash EEPROM constituted as mentioned above, the data value stored in the respective memory cell is determined by the amount of electric charges in the floating gate electrode.

More specifically, the state in which the amount of charges in the floating gate electrode is zero is referred to as a neutral state, and the state in which the floating gate electrode stores therein charges which are positive with reference to the neutral state is referred to as an erase state. Further, the erase state is made to correspond to data "0". For example, the erase operation can be executed by applying a high potential (about 20V) to the substrate and the earth potential (0V) to the control gate electrode.

The program state is referred to a state in which the floating gate electrode stores therein charges negative with reference to the neutral state thereof and made to correspond to data "1", "2" and "3". However, the amount of charges in the floating gate electrode in its data "2" state is set so as to be larger than the amount of charges in the floating gate electrode in its data "1" state, and the amount of charges in the floating gate electrode in its data "3" state is set so as to be larger than the amount of charges in the floating gate electrode in its data "2" state.

For example, the program operation can be executed by setting the substrate, the source and the drain to the earth potential (0V), respectively, and applying a high potential (about 20V) to the control gate electrode.

The structure of the memory cells in the multi-level NAND EEPROM is substantially identical with the structure of the memory cells in a general NAND EEPROM, so that, in case of the multi-level NAND EEPROM in which the data amount storable in one memory cell is larger, the memory capacity of data can naturally be increased as compared with the general NAND EEPROM in which one bit data is stored in one memory cell.

However, generally in case data of 2 or more bits is stored in one memory cell, the reliability of the data lowers in proportion as the rewrite number is increased, with reference to the case where data of one bit is stored in one memory cell.

Therefore, it is very convenient to the user side if 1-bit (2-level) data can be stored in the memory cells in the memory cell array or data of 2 bits (4-level) or more bits can be stored in the memory cells in the memory cell array in accordance with the purpose in use.

Further, in case of the NAND type flash EEPROM, the memory cell array is constituted of a main area, a spare area for storing redundant bits, and a redundancy area for relieving the defective bits in the main area or the spare area.

Here is the demand that, as for the main area and the redundancy area, data of 2 bits (4-level) ore more bits should desirably be stored in one memory cell in order to increase the memory capacity, and, as for the spare area, data of one bit (2-levels) should desirably be stored in one memory cell in order to prevent the reliability of the data from being lowered even if the rewrite number is increased.

BRIEF SUMMARY OF THE INVENTION

It is the object of the present invention to provide a non-volatile semiconductor memory having a switching function to ensure that, as the data stored in one memory cell array, data of 2 bits (4-levels) or more multi-bits (more multi-levels) can be used or data of 1 bit (2-levels) can be used.

The non-volatile semiconductor memory according to the present invention comprises a memory cell array including memory cells arranged in a matrix form a memory cell selecting means for selecting the memory cells read or programmed simultaneously, a plurality of data latch circuits provided corresponding to memory cells selected by the memory cell selecting means, a means constituted in such a manner that the plurality of data latch circuits are grouped by m (m being 2 or a greater natural number) into sets, so that, when data comprising a plurality of bits is read from or programmed into each of the plurality of select memory cells, the means selects one data latch circuit, and, when one-bit data is read from or programmed into each of the plurality of select memory cells, the means selects m data latch circuits in one set, data input/output terminals for the transmission and reception of data to and from the selected one or m data latch circuits.

The above-mentioned means selects one data latch circuit when m-bit data is to be read from or programmed into each of the plurality of select memory cells.

The non-volatile semiconductor memory according to the present invention further comprises a means which, at the time of read, selects the plurality of data latch circuits one by one or m by m successively after the means has made the data in the plurality of select memory to be latched at the same time into the plurality of data latch circuits.

The non-volatile semiconductor memory according to the present invention further comprises a means which, at the time of program, selects the plurality of data latch circuits one by one or m by m to have the data latched in the plurality of data latch circuits and then programs the data of the plurality of data latch circuits into the plurality of select memory cells at the same time.

The plurality of data latch circuits are each connected to at least one bit line and has m sub-data circuits which can latch 1-bit data.

At the time of read or program, the plurality of data latch circuits are each electrically connected to one bit line.

The plurality of data latch circuits are disposed adjacent to one end in the column direction of the memory cell array, and a plurality of data latch circuits which are of the same structure as that of the first-mentioned plurality of data latch circuits are disposed adjacent to the other end in the column direction of the memory cell array.

In case the data comprising a plurality of bits is read from or programmed into a portion of the plurality of select memory cells, and 1-bit data is read from or programmed into the other portion of the plurality of select memory cells, the means selects one data latch circuit when the data comprising a plurality of bits is read from or programmed into a portion of the plurality of select memory cells, and the means selects m data latch circuits in one set when 1-bit data is read from or programmed into the other portion of the plurality of select memory cells.

A portion of the plurality of select memory cells exists in the main area in which normal bits are stored, and the other portion of the plurality of select memory cells exists in the spare area in which redundant bits are stored.

The memory cell array has a redundancy area and, in case a portion of the plurality of select memory cells is replaced with the memory cells in the redundancy area, the plurality-of-bit data is read from or programmed into the memory cells in the redundancy area, and, in case the other portion of the plurality of select memory cells are replaced with the memory cells in the redundancy area, the 1-bit data is read from or programmed into the memory cells in the redundancy area.

In case m is 2, the plurality of data latch circuits are connected to the data input/output buffer through first, second and third data lines, and, when the 2-bit data is read from or programmed into a portion of the plurality of select memory cells, the first and second data lines or the first and third data lines are used, and, when the 1-bit data is read from or programmed into the other portion of the plurality of select memory cells, the second and third data lines are used.

The plurality of data latch circuits each comprise two sub-data circuits which each can latch 1-bit data, the first data line is connected to first sub-data circuits of the plurality of data latch circuits, the second data line is connected to the second sub-data circuits in a predetermined number of data latch circuits, the third data line is connected to the second sub-data circuits in the data latch circuits excepting the predetermined number of data latch circuits.

In case the above-mentioned m is 2, the plurality of data latch circuits are connected to a data input/output buffer through first to fourth data lines, and, when 2-bit data is read from or programmed into a portion of the plurality of select memory cells, the first and second data lines or the third and fourth data lines are used, and, when 1-bit data is read from or programmed into the other portion of the plurality of select memory cells, the first and third data lines or the second and fourth data lines are used.

The plurality of data latch circuits each comprise two sub-data circuits which each can latch 1-bit data, and the first data line is connected to first sub-data circuits in a predetermined number of data latch circuits, the second data line is connected to the second sub-data circuits in the predetermined number of data latch circuits, the third data line is connected to the first sub-data circuits in the data latch circuits excepting the predetermined number of data latch circuits, and the fourth data line is connected to the second sub-data circuits in the data latch circuits excepting the predetermined number of data latch circuits.

The non-volatile semiconductor memory is of the type that plurality-of-bit data is stored in one memory cell and comprises a means which, at the time of read, achieves the read of data from the above-mentioned one memory cell by a plurality of continuous read operations, and a means which, at the time of test, executes the plurality of read operations separately from one another to confirm whether the respective operations are normal or not.

The non-volatile semiconductor memory according to the present invention comprises a means which, at the time of program, achieves the program of data into memory cells by repeating a program operation and a verify operation, and a means which always renders the data in all the memory cells to "0" or compulsorily renders, into a fail state, a flag showing the result of a verify into a fail state, and makes the program operation and the verify operation to be performed repeatedly up to the maximum loop count.

The non-volatile semiconductor memory according to the present invention further comprises a means which, at the time of test, repeatedly performs the program operation and the verify operation up to the maximum loop count to thereby perform a stress test.

Additional objects and advantages of the invention will be set forth in the description which follows, and in part will be obvious from the description, or may be advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
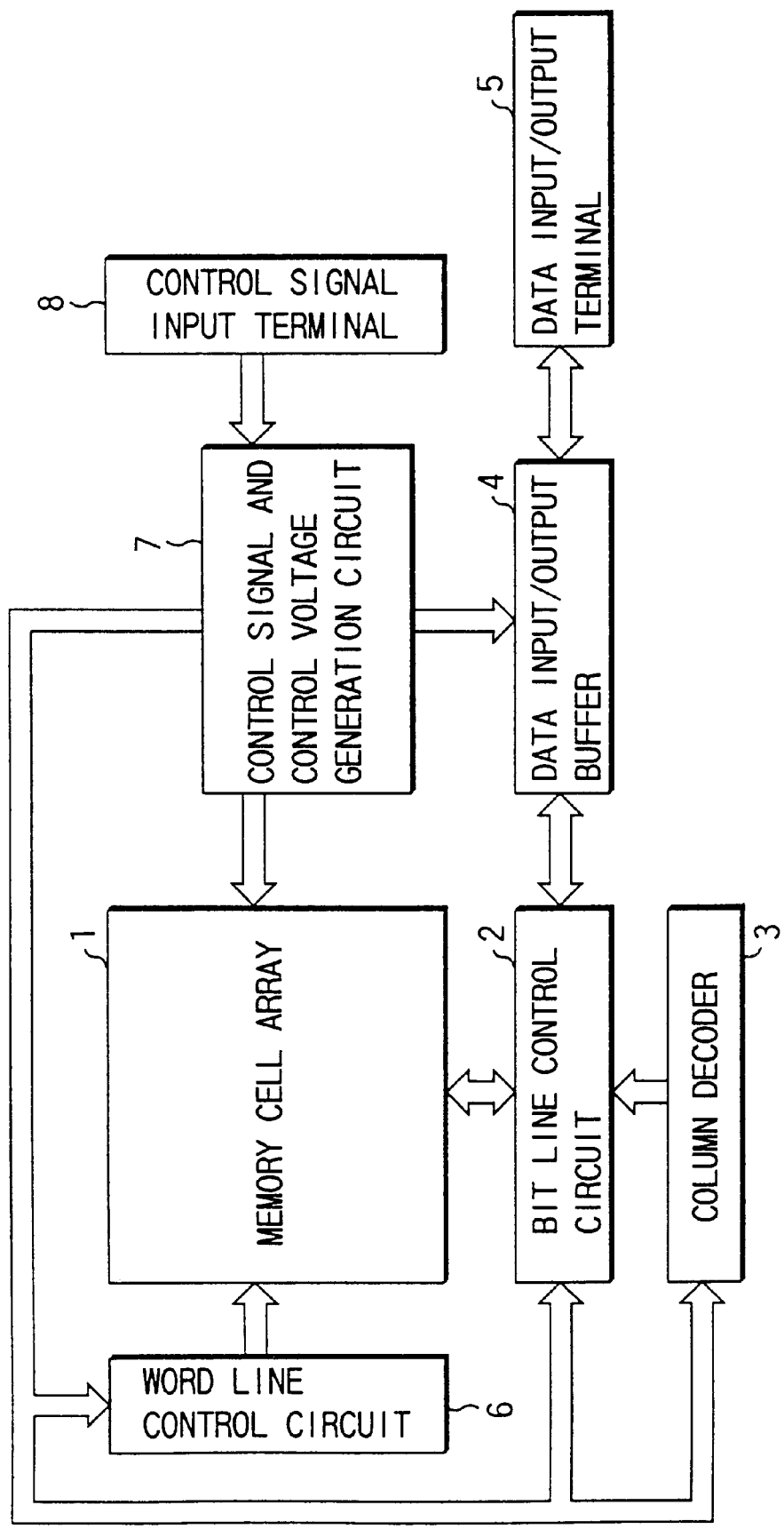
FIG. 1 is a block diagram showing a conventional non-volatile semiconductor memory.

The non-volatile semiconductor memory according to the present invention will now be described in detail, referring to the drawings.

Figure 2:
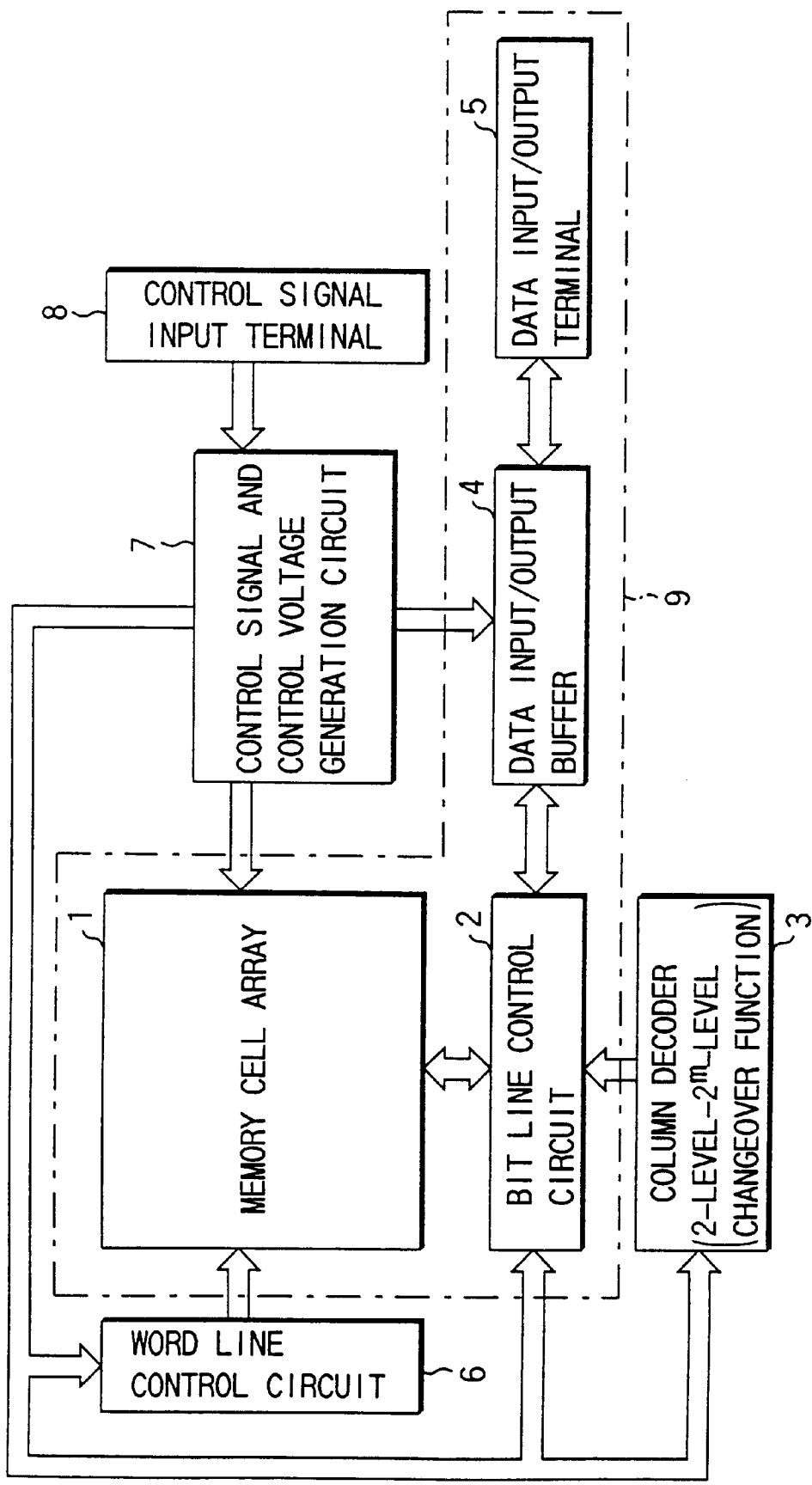
FIG. 2 is a block diagram showing the non-volatile semiconductor memory according to the present invention.
Figure 3:
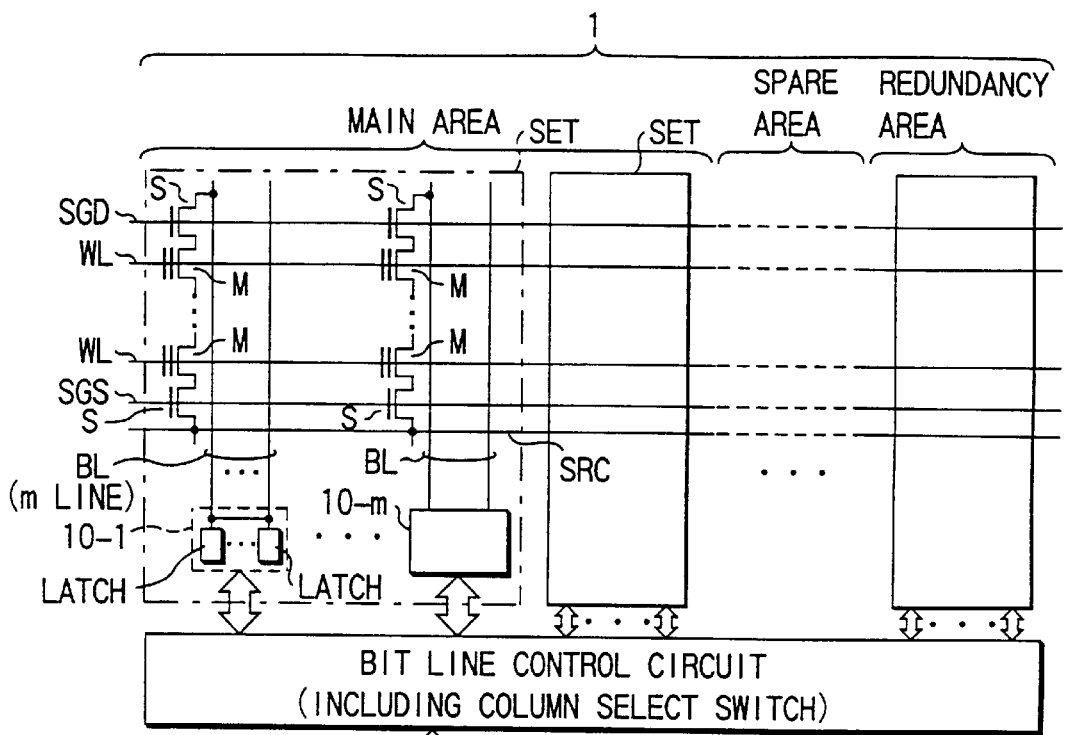
FIG. 3 is a schematic diagram showing the portion 9 shown in FIG. 2.

[A] FIG. 2 shows the essential portion of the non-volatile semiconductor memory according to the present invention. FIG. 3 shows in detail the region indicated by the reference numeral 9 in FIG. 2.

A memory cell array 1 has a plurality of memory cells M disposed in the shape of a matrix. These memory cells M are constituted in such a manner that the data stored therein can be electrically rewritten. Further, disposed in the memory cell array 1 are a plurality of word lines (control gate electrodes) WL, a plurality of bit lines BL, and a source line SRC connected in common to the sources of a plurality of (or all) memory cells.

Further, disposed close to the memory cell array 1 are a bit line control circuit 2 which executes control over the potential of the bit lines BL, etc. and a word line control circuit 6 which performs control over the potential of the word lines WL, etc.

The bit line control circuit 2 is provided, for example, for outputting the data in the memory cells in the memory cell array 1 to the outside of the chip via the bit lines BL at the time of read, for detecting the state of the memory cells in the memory cell array 1 at the time of verify, and for applying a program control voltage to the memory cells in the memory cell array 1 at the time of program.

The bit line control circuit 2 includes a plurality of data latch circuits 10-1, . . . 10-m, which can hold data corresponding in amount to one page of the memory cell array 1; and the data corresponding in amount to one page is held in the data latch circuits 10-1, . . . 10-m, . . . .

Here, it is to be noted that, according to the present invention, the memory cells M are constituted so as to be able to store therein m-bit (2m-level) data as well as 1-bit (2-level) data (wherein m stands for 2 or a greater natural number).

In this case, one data latch circuit 10-1 has m sub-data circuits LATCH and is connected to at least one bit line BL. Further, the m data latch circuits 10-1, . . . 10-m constitute one set, so that, in case of storing 1-bit (2-level) data in one memory cell, the transmission and reception of data are performed at the same time between the data input/output terminal 5 and the m data latch circuits 10-1, . . . 10-m in one set. On the other hand, in case of storing m-bit (2m-level) data in one memory cell, data transmission and reception are performed between the data input/output terminal 5 and one data latch circuit 10-1 as in the normal case.

At the time of read, the data latch circuit 10-1 for example is electrically connected to one bit line to latch the data read from the memory cells connected to this one bit line. Further, at the time of program, likewise, the data latch circuit 10-1 is electrically connected to at least one bit line to latch the data to be programmed into the memory cells connected to this one bit line.

The word line control circuit 6 selects one of the word lines in the memory cell array 1 and applies, to the one word line thus selected (selected word line) and the other word lines (non-selected word lines), predetermined potentials corresponding to the read mode, the program mode and the erase mode, respectively. 5 The memory cell array 1, the bit line control circuit 2, the column decoder 3, the data input/output buffer 4 and the word line control circuit 6 are controlled by a control signal and control voltage generation circuit 7.

Figure 4:
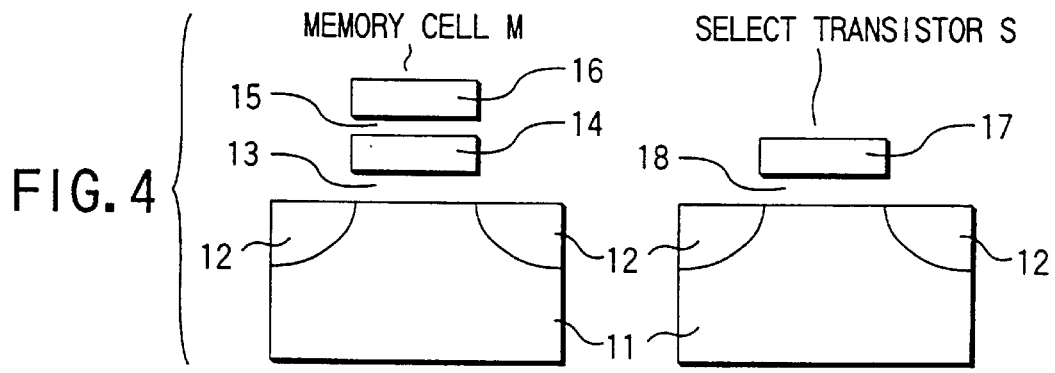
FIG. 4 is a schematic diagram showing the structure of a memory cell and a select transistor.

FIG. 4 shows the structure of the memory cell M and the select transistor S shown in FIG. 3.

On the surface of a p-type semiconductor substrate (or a p-type well) 11, n-type diffusion layers 12 are formed, one of which is used as a drain, the other being used as a source.

The memory cell M has a floating gate electrode 14 formed through an insulation film 13 on the semi-conductor substrate 11 and a control gate electrode (word line) 16 formed through an insulation film (such as a so-called ONO film) 15 on the floating gate electrode 14 thus formed. The select transistor S has a select gate electrode 18 formed through an insulation film 17 on the semiconductor substrate 11.

By applying to the control gate 16 of the memory cell M a potential higher than the threshold value, a channel is formed directly beneath the floating gate electrode 14.

If it is assumed, for example, that the capacitance between the control gate electrode 16 and the floating gate electrode 14 is 1 fF, the capacitance between the floating gate electrode 14 and the channel is 1 fF, the capacitance between the channel and the substrate is 0.25 fF, and the capacitance between the n-type diffusion layers 12 and the substrate 11 is 0.25 fF (which is the sum capacitance value with respect to the two diffusion layers), then the capacitive coupling ratio between the control gate electrode 16 and the channel (or the n-type diffusion layers 12) is about 50%. If the voltage of the control gate electrode 16 rises by 1V when the channel and the n-type diffusion layers 12 are in a floating state, then the potential of the channel or the n-type diffusion layers 12 rises by 0.5V.

Figure 5:
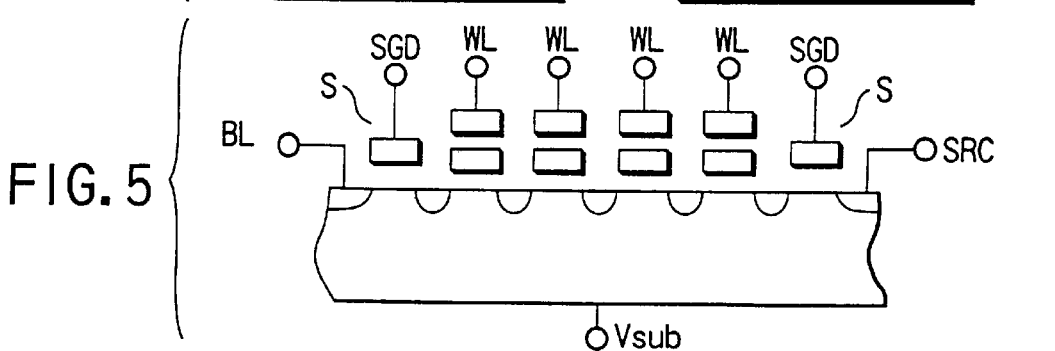
FIG. 5 is a schematic diagram showing the structure of a NAND cell unit.

FIG. 5 shows the structure of the NAND cell unit shown in FIG. 3.

The NAND cell column is comprised of a plurality of (such as, e.g., four) memory cells M connected in series. One end of the NAND cell row is connected to the source line SRC via a select transistor S, while the other end is connected to the bit line BL via a select transistor S.

Figure 6:
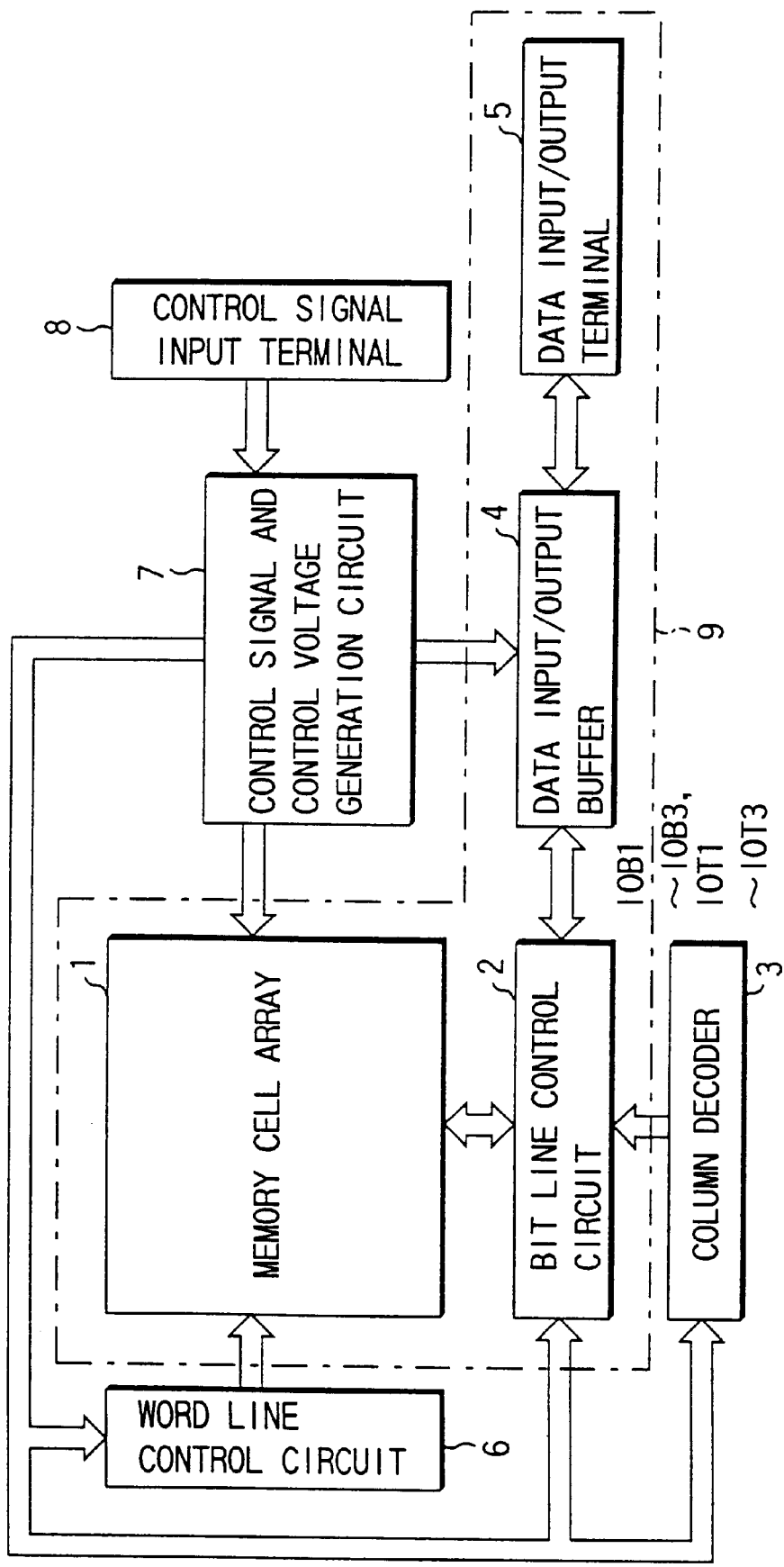
FIG. 6 is a block diagram showing the flash EEPROM according to a first embodiment of the present invention.
Figure 7:
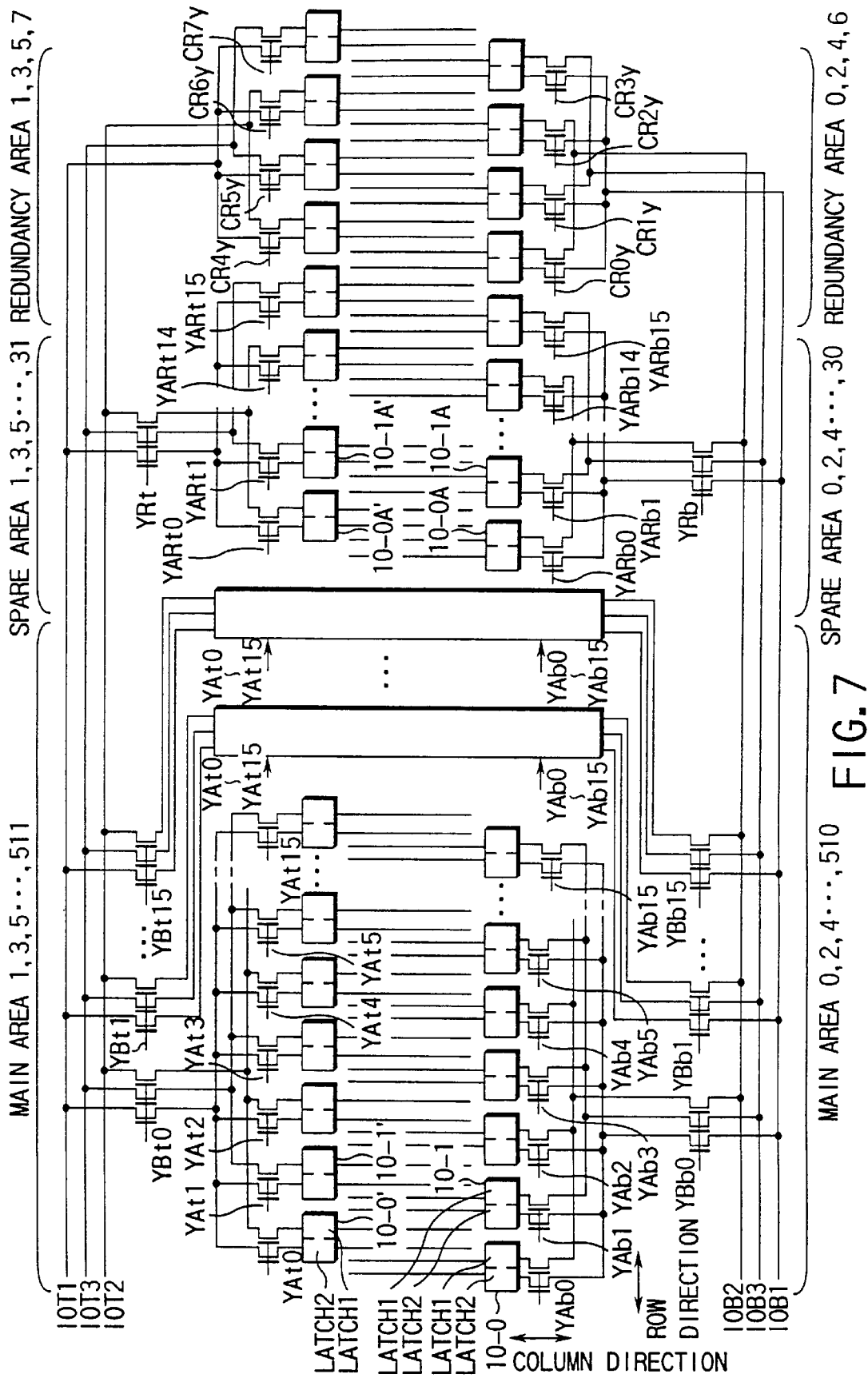
FIG. 7 is a schematic diagram showing in detail a portion of the memory cell array and a portion of the bit line control circuit shown in FIG. 6.
Figure 8:
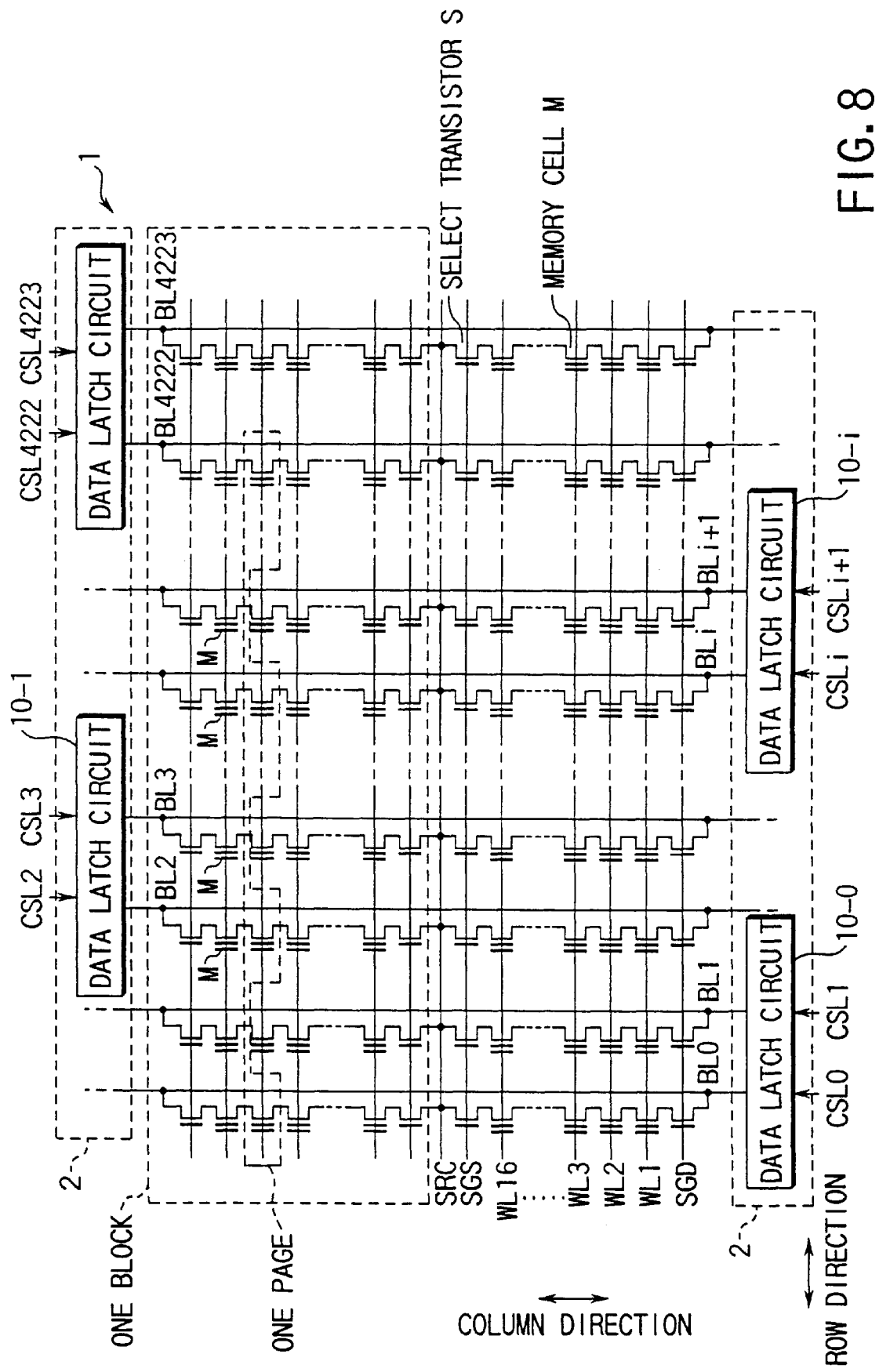
FIG. 8 is a schematic diagram showing in detail a portion of the memory cell array and a portion of the bit line control circuit shown in FIG. 6.

B) FIG. 6 shows the essential portion of the 4-level NAND flash EEPROM according to a first embodiment of the present invention. FIG. 7 and FIG. 8 show in detail a portion of the memory cell array and a portion of the bit line control circuit.

The memory cell array 1 has a plurality of NAND cell units. The NAND cell units each is comprised of, for example, a NAND column comprising 16 memory cells M connected in series and the select transistors S connected at both ends of the NAND column. One end of the respective NAND cell unit is connected to the source line SRC, while the other end is connected to the bit lines BL0, BL1, . . . .

Further, the memory cell array 1 is comprised of a plurality of blocks, each of which includes 4224 NAND cell units in the row direction. One page means the unit of data which can be read or programmed at the same time. Further, the data which can be simultaneously read or programmed is latched in the data latch circuits 10-0, 10-1, . . . .

The memory cell array 1 is comprised of a main area, a spare area and a redundancy area. In the main area, normal data is stored, so that, in the main area, it is advisable to store 4-level data in the memory cells M.

In the spare area, redundancy bits are stored, so that, in the spare area, it is advisable to store 2-level data in the memory cells M in order to secure a high reliability even if the program number is increased. The redundancy area is provided in order to relieve defective bits in the main area or the spare area, so that, in the memory cells M, 2-level or 4-level data is stored.

In the memory cell array 1, there are disposed a plurality of word lines (control gate electrodes) WL1 to WL16, a plurality pf bit lines BL0, BL1, . . . and a source line SRC connected in common to the sources of a plurality of (or all) memory cells.

Further, disposed close to the memory cell array 1 are the bit line control circuit 2 which performs control over the potential of the bit lines BL0, BL1, . . . , etc. and a word line control circuit 6 which performs control over the potential of the word lines WL1 to WL16.

The bit line control circuit 2 is provided, for example, for outputting the data of the memory cells M in the memory cell array 1 to the outside of the chip via the bit lines BL0, BL1, at the time of read, for detecting the state of the memory cells M in the memory cell array 1 at the time of verify, and for applying a program control voltage to the memory cells M in the memory cell array 1 at the time of program.

In case of this embodiment, two bit line control circuits 2 are disposed at both ends, in the column direction, of the memory cell array 1 in such a state that the memory cell array 1 is interposed therebetween. The bit line control circuits 2 each includes a plurality of data latch circuits 10-0, 10-1, . . . 10i, . . . , which can hold data corresponding to one page; and data corresponding to one page is held in the plurality of data latch circuits 10-0, 10-1, . . . 10i, . . . .

The bit line control circuits 2 are disposed at both ends in the column direction of the memory cell array 1, so that the width in the row direction of the area in which the data latch circuits are disposed can be increased. It can be determined by, e.g., the least significant address AO in which one of the two bit line control circuits 2 the data is to be latched.

Further, in the memory cells M, 2-bit (4-level) data is stored in addition to 1-bit (2-level) data. In this case, one data latch circuit 10-0 has two sub-data circuits LATCH1 and LATCH2 and is connected to two bit lines BL0 and BL1.

Further, in each of the bit line control circuits 2, for example the two data latch circuits adjacent to each other form one set, so that, in case of storing 1-bit (2-level) data in one memory cell, the transmission and reception of data is effected at the same time between the data input/output terminal 5 and the two data latch circuits in one set when program is performed and when read is performed.

On the other hand, in case storing 2-bit (4-level) data in one memory cell, the transmission and reception of data is effected between the data input/output terminal 5 and one data latch circuit at the time of program and at the time of read.

At the time of program and read, a predetermined one of the two bit lines connected to one data latch circuit 10i is selected, and program or read is executed to or from the memory cell coupled to the thus selected bit line.

As data lines connecting each of the bit line control circuits 2 to the data input/output buffer 4, there are provided three lines (IOB1 to IOB3, IOT1 to IOT3). Further, there are provided two data input/output terminals 5, so that 1-bit (2-level) data or 2-bit (4-level) data is inputted and outputted through these two data input terminals 5.

In the main area of the memory cell array 1, the transmission and reception of data between the data latch circuits 10-0, 10-1, . . . in the bit line control circuits 2 and the data input/output terminals 5 are controlled by the select signals YAb0 to YAb15, YAt0 to YAt15, and YBb0 to YBb15, YBt0 to YBt15 outputted from the column decoder 3.

Further, in the spare area of the memory cell array 1, the transmission and reception of data between the data latch circuits in the bit line control circuits 2 and the data input/output terminals 5 are controlled by select signals YARb0 to YARb15, YARt0 to YARt15, YRb, and YRt outputted from the column decoder 3.

Further, in the redundancy area of the memory cell array 1, the transmission and reception between the data latch circuits in the bit line control circuits 2 and the data input/output terminals 5 are controlled by select signals CR07 to CR7y outputted from the column decoder 3.

The word line control circuit 6 selects one of the word lines in the memory cell array 1 and applies, to the one word line (selected word line) and the other word lines (non-selected word lines), predetermined voltages corresponding to the read, program, and erase modes, respectively.

The memory cell array 1, the bit line control circuits 2, the column decoder 3, the data input/output buffer 4 and the word line control circuits 6 are controlled by a control signal and control voltage generation circuit 7.

The portion surrounded by a one-dot broken line 9 in FIG. 6 is set as one unit; and, in one chip, one such unit or a plurality of such units are disposed.

According to the NAND type flash EEPROM constituted as mentioned above, three data lines IOB1 to IOB3, IOT1 to IOT3 are provided with respect to one memory cell M so that either 1-bit (2-level) data or 2-bit (4-level) data can be read or programmed.

That is, to one sub-data circuit LATCH2 of the sub-data circuits in the data latch circuits, the data line 10B1 (10T1) is connected, and, to the other sub-data circuits LATCH1 in a predetermined number of (every other) data latch circuits 10-0, . . . , the data lines 10B3 (10T3) is connected, and, to the other sub-data circuits LATCH1 in the data latch circuits 10-1, . . . excepting the predetermined number of data latch circuits, the data line 10B2 (10T2) is connected.

By so doing, for example in case of storing 1-bit (2-level) data, the other sub-data circuits LATCH1 in the respective two mutually adjacent data latch circuits and the data liens 10B2 and 10B3 are used. Further, in case of storing 2-bit (4-level) data, both sub-data circuits LATCH1 and LATCH2 in one data latch circuit and the data lines 10B1 and 10B2 or the data lines 10B1 and 10B3 are used.

It is determined, for example, by the least significant A0 whether the data lines 10B1 to 10B3 are used or the data lines 10T1 to 10T3 be used.

Further, in case the respective two mutually adjacent data latch circuits form one set and 1-bit (2-level) data is stored in one memory cell, the transmission and reception of the data are executed at the same time between the data input/output terminals 5 and the two data latch circuits in one set at the time of program and at the time of read.

On the other hand, in case of storing 2-bit (4-level) data in one memory cell, the transmission and reception of the data is executed between the data input/output terminals 5 and one data latch circuit, as in the ordinary case, at the time of program and at the time of read.

These operations can be controlled by the select signals YAb0 to YAb15, YAt0 to YAt15, YBb0 to YBb15, YBt0 to YBt15, YARb0 to YARb15, YARt0 to YARt15, YRB, YRt, and CROy to CR7y.

As stated above, according to the present invention, it is possible to store data of 2 bits (4-level) or more multi-bits (more multi-levels) or data of 1 bit (2-level) can be stored in one memory cell.

Figure 9:
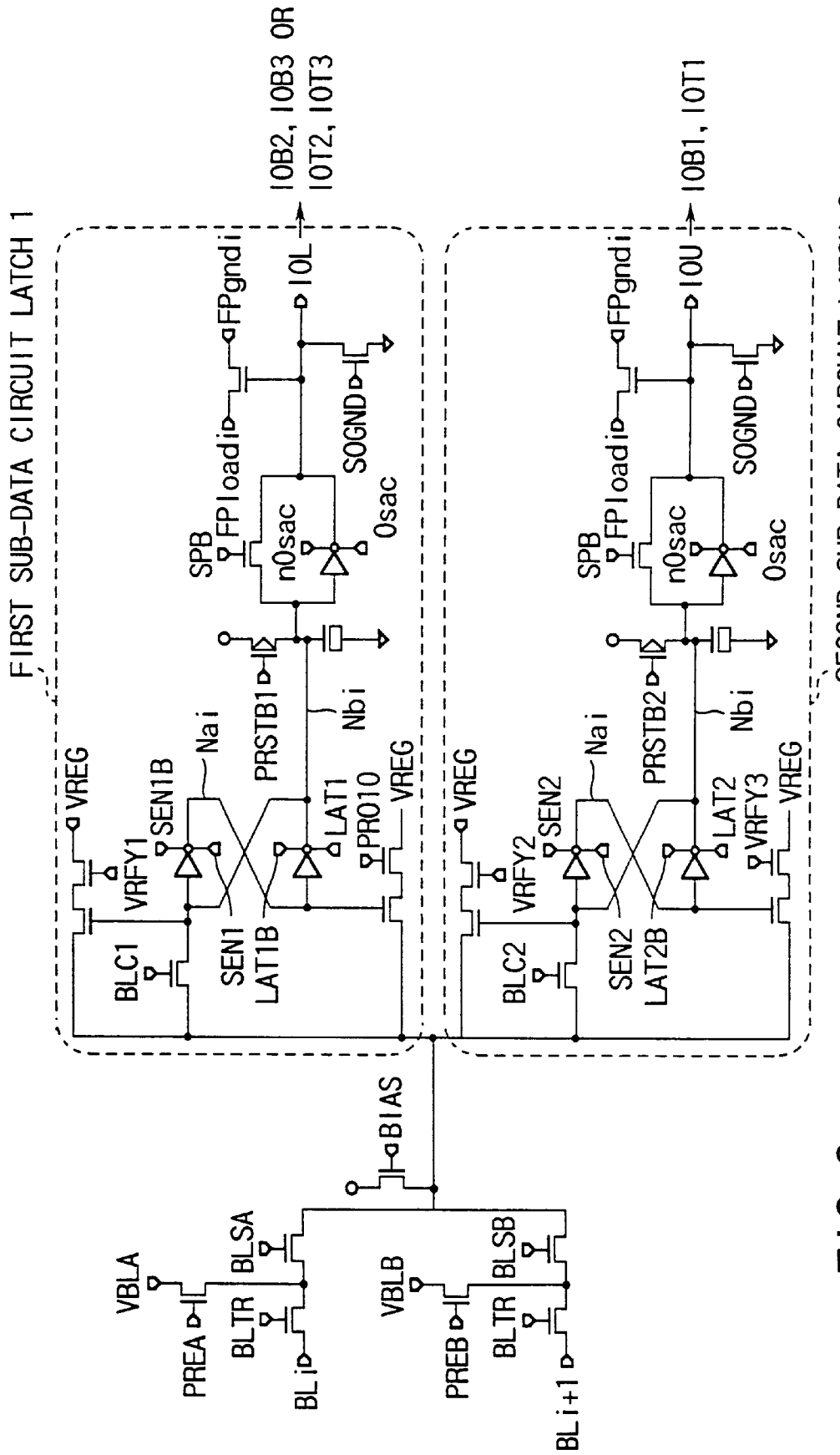
FIG. 9 is a circuit diagram showing a specific example of the data latch circuit shown in FIG. 7 and FIG. 8.
Figure 10:
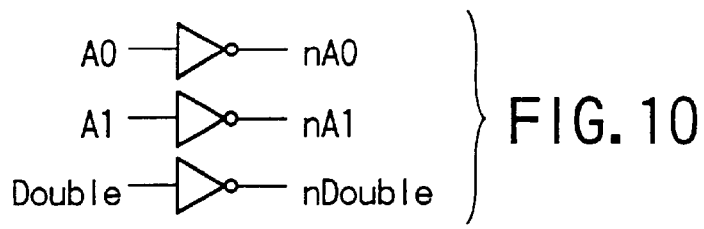
FIG. 10 is a schematic diagram showing a portion of the output route of the data input/output buffer shown in FIG. 6.
Figure 11:
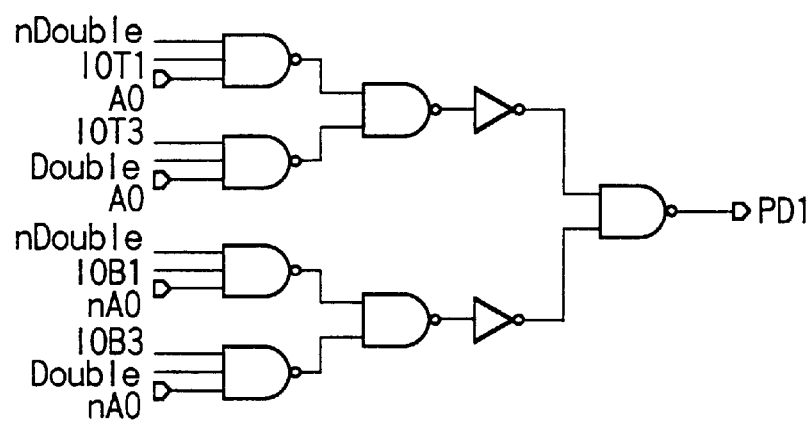
FIG. 11 is a schematic diagram showing a portion of the output route of the data input/output buffer shown in FIG. 6.
Figure 12:
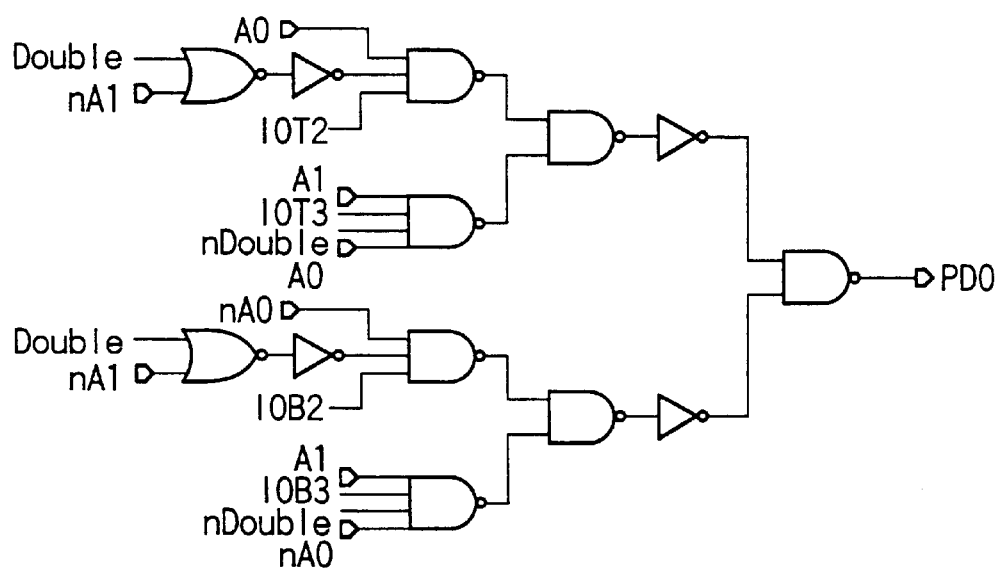
FIG. 12 is a schematic diagram showing a portion of the output route of the data input/output buffer shown in FIG. 6.

FIG. 9 shows an example of the structure of the data latch circuits shown in FIG. 7 and FIG. 8. FIGS. 10 to 12 show the output route of the data in the input/output buffer shown in FIG. 6, and FIGS. 13 to 15 show the input route of the data in the input/output buffer shown in FIG. 6.

The operation of the NAND type flash EEPROM according to the first embodiment of the present invention will be described on the basis of these FIGS. 9 to 15. Further, the relationship between the data in the memory cells and the threshold value of the memory cells are defined as shown in Table 1.

TABLE 1

| Data in memory cells | Threshold value of memory cells |
| --- | --- |
| 0 | 0 V or below |
| 1 | 0.3 V to 0.7 V |
| 2 | 1.5 V to 1.9 V |
| 3 | 2.7 V to 3.1 V |

(1) Normal Read Operation.

Figure 16:
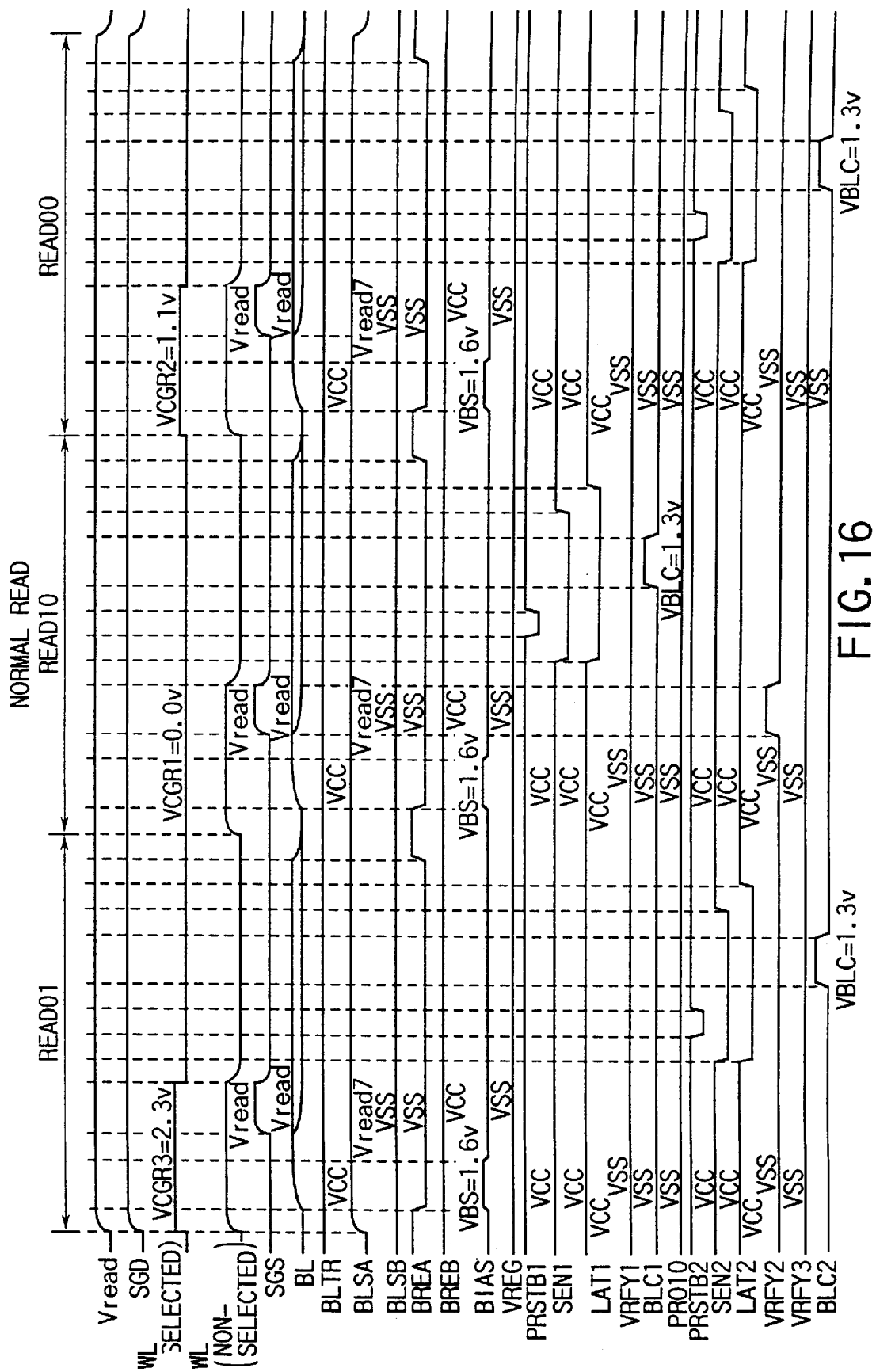
FIG. 16 is a timing chart showing the normal read operation.

FIG. 16 shows a timing chart pertaining to the normal read operation.

First, by an address signal given from outside the chip, one of the two bit lines Bli, Bli+1 connected to the data latch circuits is designated, and the thus designated bit line is couple to the data latch circuits. Further, by an external address signal given from outside the chip, one word line is selected, whereby the one page shown in FIG. 8 is selected. That is, the read operation is executed simultaneously with respect to the plurality of memory cells in the one page.

The normal read is achieved by performing the following three operations (READ01, READ10, READ00):

* READ01

All the non-selected word lines in the block (selected block) including the selected word line are set to about 4.5V, and the select gate electrode SGD in the selected block is set to about 4.5V. By so doing, the non-selected memory cells in the selected block are brought into ON state. The select word line is set to about 2.3V.

After this, the signal BIAS becomes about 1.6V, and thus, the selected bit line is precharged. Further, an "H" level potential is applied to the select gate electrode SGS in the selected block. Here, in case the data in the selected memory cell is "0", "1", "2", the selected memory cell is turned into ON state to discharge the charges in the selected bit line, but, in case the data in the selected memory cell is "3", the selected memory cell is turned into OFF state; and thus, the charges in the selected bit line is not discharged.

Further, a signal PRSTB2 applied to the second sub-data circuit in the data latch circuit shown in FIG. 9 becomes "L", whereby a node Nbi is rendered into "H" level. Here, if a signal BLC2 is brought into an intermediate potential to discharge the charges in the selected bit line, then the node Nbi is brought to "L" level, but, in case the charges in the selected bit line are left, the node Nbi remains in "H" level.

In this operation, in case the data in the selected memory cell is "0", "1", "2", "L" ("1" data) is stored in the node Nbi of the second sub-data circuit, and, in case the data in the selected memory cell is "3", "H" ("0" data) is stored in the node Nbi of the second sub-data circuit.

* READ10

All the non-selected word lines in the selected block are set to about 4.5V, and the select gate electrode SGD in the selected block is set to about 4.5V. As a result, the non-selected memory cells in the selected block are turned on. The selected word line is set to 0V.

After this, the signal BIAS becomes about 1.6V, so that the selected bit line is precharged. Further, an "H" level potential is applied to the select gate electrode SGS in the selected block. Here, in case the data in the elected memory cell is "0", the selected memory cell is tuned on to discharge the charges in the selected bit line, but, in case the data in the selected memory cell is "1", "2", "3", the selected memory cell is turned off in principle; and thus, the charges in the selected bit line are not discharged.

However, in case the node Nbi of the second sub-data circuit read by the READ01 operation is "H" (when the data in the selected memory cell is "3"), a signal VRFY2 is turned into "H" level, whereby the charges in the selected bit line are discharged to bring the selected bit line to VSS (0V).

Then, the signal PRSTB1 applied to the first sub-data circuit in the data latch circuit shown in FIG. 9 becomes "L", whereby the node Nbi becomes "H". Here, if the signal BLC1 becomes an intermediate potential, and thus, the charges in the selected bit line are discharged, then the node Nbi becomes "L" in level, but, in case charges are left in the selected bit line, the node Nbi remains in "H" level.

In this operation, in case the data in the selected memory cell is "0", "3", "L" ("1" data) is stored in the node Nbi in the first sub-data circuit, and, in case the data in the selected memory cell is "1", "2", "H" ("0" data) is stored in the node Nbi of the first sub-data circuit.

* READ00

All the non-selected word lines in the selected block are set to about 4.5V, and the select gate electrode SGD in the selected block is set to about 4.5V. As a result, the non-selected memory cells in the selected block are turned on. The selected word line is set to about 1.1V, After this, the signal BIAS becomes about 1.6V, and thus, the selected bit line is precharged. Further, to the select gate electrode SGS in the selected block, an "H" level potential is applied. Here, in case the data in the selected memory cell is "0", "1", the selected memory cell is turned on, so that the charges in the selected bit line are discharged, but, in case the data in the selected memory cell is "2", "3", the selected memory cell is turned off, so that the charges in the selected bit line are not discharged.

Further, the signal PRSTB2 applied to the second sub-data circuit in the data latch circuit shown in FIG. 9 becomes "L", so that the node Nbi becomes "H". Here, if the signal BLC2 assumes an intermediate potential to discharge the charges in the selected bit line, then the node Nbi becomes "L", but, in case charges are left in the selected bit lines, the node Nbi remains "H" invariably.

In this operation, in case the data in the selected memory cell is "0", "1", "L" ("1" data) is stored in the node Nbi in the second sub-data circuit, and, in case the data in the selected memory cell is "2", "3", "H" ("0" data) is stored in the node Nbi in the second sub-data circuit.

In this way, in the normal read, the (4-level) data in memory cells corresponding to one page is latched in the data latch circuit by three or more operations.

Table 2 shows the relationship between the data in the memory cell and the data latched in the data latch circuit.

Further, the first read sub-data is referred to the data latched in the first sub-data circuit shown in FIG. 9, and the second read sub-data is referred to the data latched in the second sub-data circuit shown in FIG. 9.

TABLE 2

|  | Data latch circuit | |
| --- | --- | --- |
| Data in memory cells | First read sub-data | Second read sub-data |
| 0 | 1 | 1 |
| 1 | 0 | 1 |
| 2 | 0 | 0 |
| 3 | 1 | 0 |

The data latched in the data latch circuit is serially led to the input/output buffer under the control of the select signal outputted from the column decoder and then outputted to the outside of the chip via the input/output terminal.

(2) Program Operation

First, program data (4-level data) corresponding in amount to one page is latched in the data latch circuits. For example, in case of programming data "0" into the memory cells, the nodes Nai in the first and second sub-data circuits of the data latch circuits are both alike rendered to "L", and the sub-data in the first and second sub-data circuits are both alike rendered to "0".

Further, in case of programming data "1" into the memory cells, the node Nai in the first sub-data circuit of the respective data latch circuit is made "H", and the node Nai in the second sub-data circuit is made "L", the sub-data in the first sub-data circuit is made "1", and the sub-data in the second sub-data circuit is made "0".

Further, in case of programming data "2" into the memory cells, the nodes Nai in the first an second sub-data circuits of the respective data latch circuit are made "H", and the sub-data in the first and second sub-data circuits are both alike made "1".

Further, in case of programming data "3" into the memory cells, the node Nai in the first sub-data circuit of the respective data latch circuit is made "L", the node Nai in the second sub-data circuit is made "H", the sub-data in the first sub-data circuit is made "0", and the sub-data in the second sub-data circuit is made "1".

Further, under the control of the select signal outputted form the column decoder, the program data corresponding in amount to one page is serially led from the input/output buffer to the data latch circuits.

Table 3 shows the relationship between the data (initial control data) programmed into the memory cells and the data (initial sub-data) latched in the data latch circuits.

TABLE 3

| Initial control data | Data latch circuit | |
| --- | --- | --- |
| | Initial sub-data in the first sub-data circuit | Initial sub-data in the second sub-data circuit |
| 0 | 0 | 0 |
| 1 | 1 | 0 |
| 2 | 1 | 1 |
| 3 | 0 | 1 |

"1" → Execute program
When verify is OK, "1" → "0" change → Table 4 (Sub-data)

Figure 17:
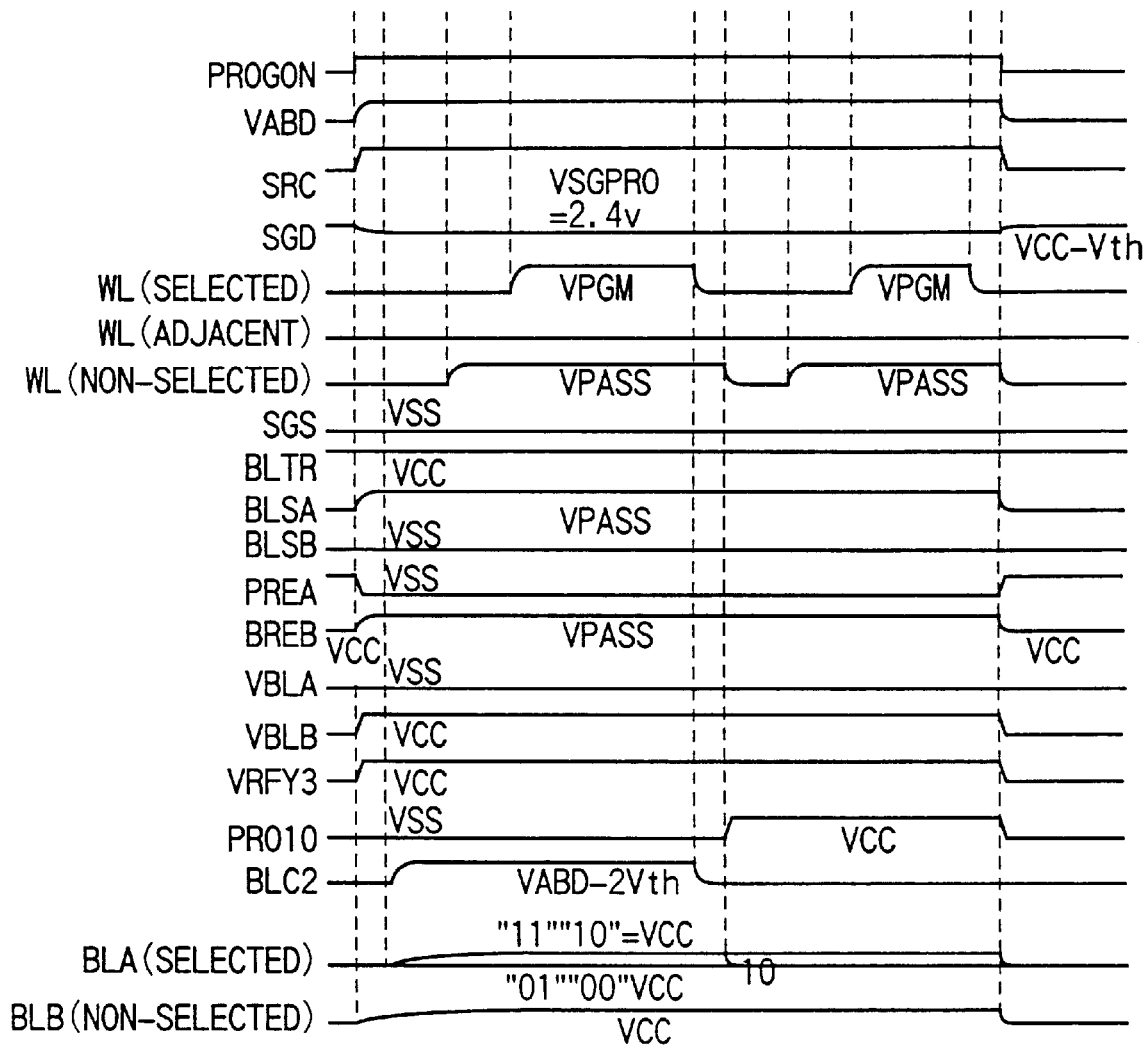
FIG. 17 is a timing chart showing the program operation.
Figure 19A:
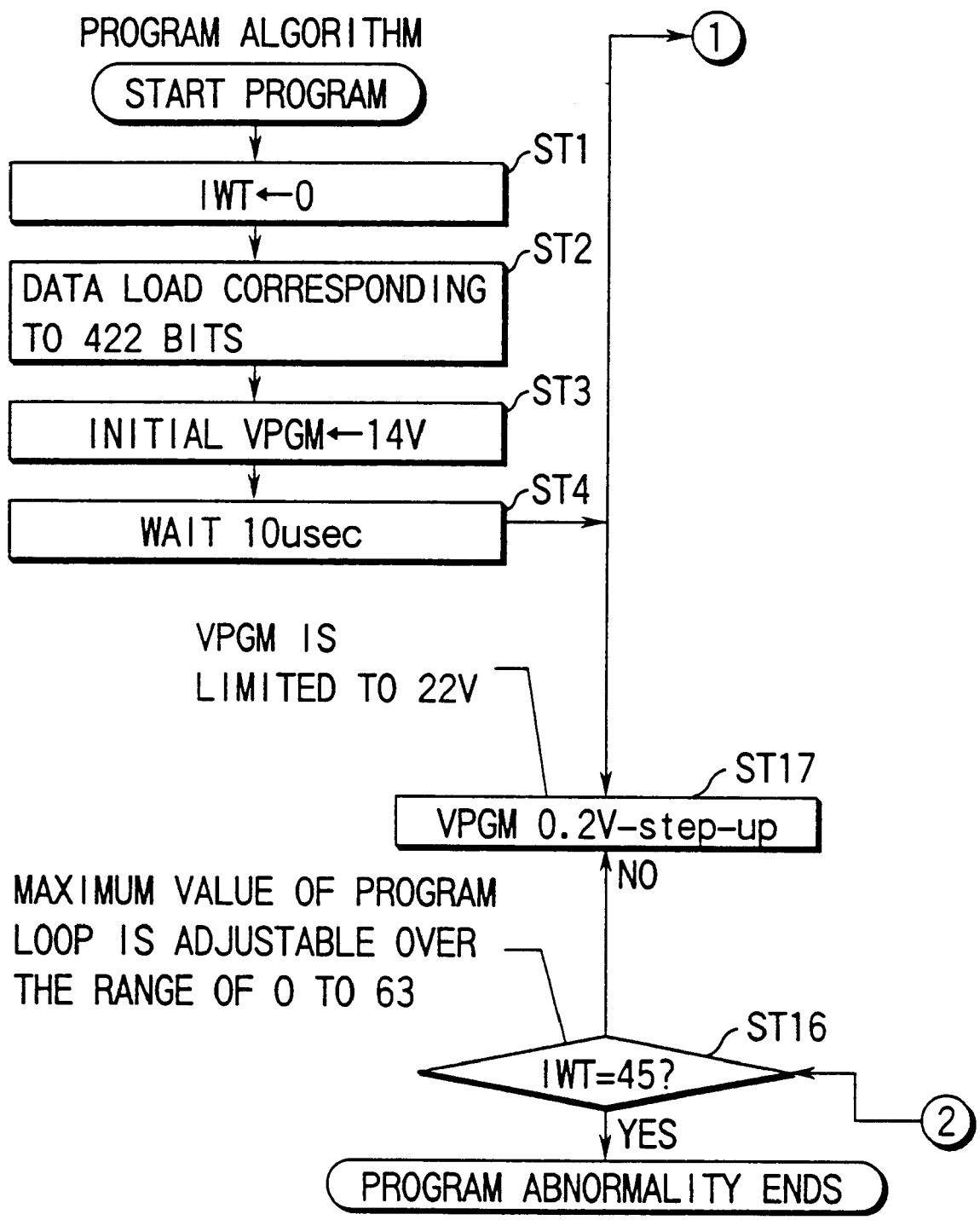
FIG. 19A and FIG. 19B are, respectively, schematic diagrams showing the algorithm of the program operation.
Figure 19B:
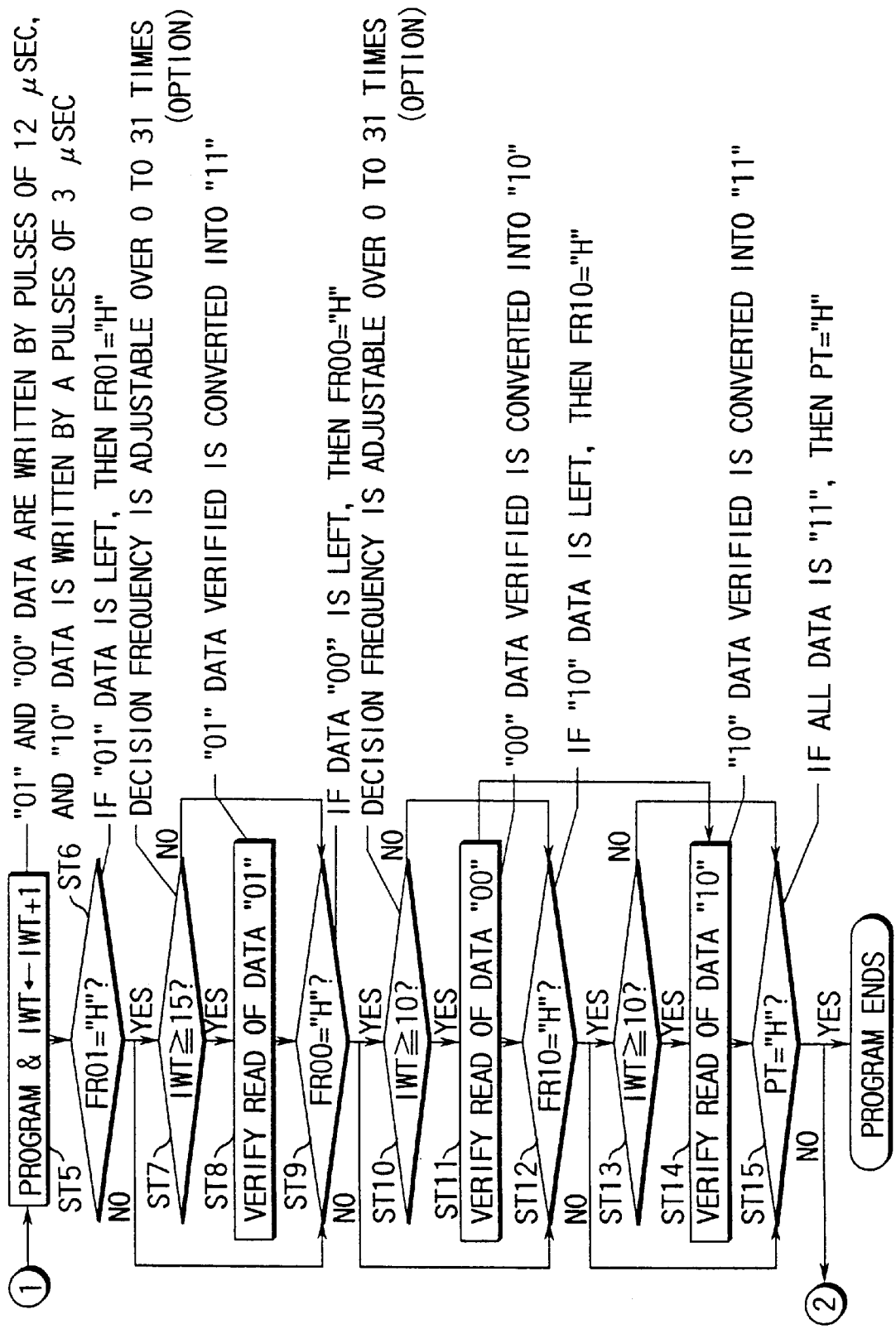

After this, the data, corresponding in amount to one page, in the data latch circuits is programmed into the memory cells at the same time in accordance with the program operation timing chart shown in FIG. 17 and the program algorithm shown in FIG. 19A and FIG. 19B.

That is, by the address signal fed from outside of the chip, BLSA becomes "H" and BLSB becomes "L", or BLSA becomes "L" and BLSB becomes "H", so that one of the two bit lines Bli, Bli+1 connected to the data clutch circuits is selected, and the thus selected bit line is coupled to the data latch circuits.

In case the bit line which has not been selected is Bli, PREA becomes "H" and VBLA becomes "H", so that, to this bit line Bli, a potential is always applied. Similarly, in case the bit line which has not been selected is Bli+1, PREB becomes "H", and VBLB becomes "H", so that, to this bit line Bli+1, potential is always applied.

Further, when the signal BLC2 becomes VABD −2Vth (about 7V), the data latched in the second sub-data circuit is outputted onto the selected bit line.

Further, as shown in Table 3, when data "0" or "1" is programmed into the memory cells, a positive potential is given to the bit line since the data in the second sub-data circuits is "0". Further, when data "2" or "3" is programmed into the memory cells, the potential of the bit line becomes VSS since the data in the second sub-data circuits is "1".

Further, to the select gate electrode SGD in the selected block, VSGPRO (about 2.4V) is applied, and, to the non-selected word lines, a predetermined potential VPASS is applied (to the non-selected word line adjacent to the selected word line, VSS is applied). Further, when the program potential VPGM is applied to the selected word line, program is executed to the memory cells whose bit line has the potential VSS, and no program is executed to the memory cells to whose bit line a positive potential is applied.

After this, the signal BLC2 shown in FIG. 9 becomes "L", and, when the potential of all the word lines becomes VSS, the first program is terminated.

Further, the signal PRO10 becomes "H". In case the data in one of the first and second sub-data circuits is "1", the potential of the bit line becomes VSS. As for the memory cells whose bit lines have the potential VSS, a second program is executed in the same manner as in the case of the first program.

That is, to the memory cells to which "3" or "2" is to be programmed, program is executed twice in succession, and, to the memory cells to which "1" is to be programmed, program is executed once. Further, to the memory cells to which "0" is to be programmed (in other words, no program is to be executed), program is not executed.

Until it is decided that program is OK in the program verify operation to be described later, the above-mentioned first and second program operations are repeatedly executed. Further, if it is decided that program is OK, the data in the first and second sub-data circuits are both compulsorily set to "0".

When the first and second sub-data circuits both alike become data "0", there is brought about a state in which a positive potential is always applied to the bit line; and thus, no program comes to be executed.

(3) Program Verify Read Operation

Program verify operation is an operation to verify whether or not predetermined data is accurately programmed in the memory cells and execute re-write in case the program is not sufficient. When the state of the memory cells is checked, and it is decided that the threshold value of the memory cells has reached a predetermined value, the data latched in the first and second sub-data circuits are compulsorily rendered to "0". On the other hand, in case the threshold value of the memory cells has not reached the predetermined value, the alteration of the data latched in the first and second sub-data circuits is not made.

Figure 18:
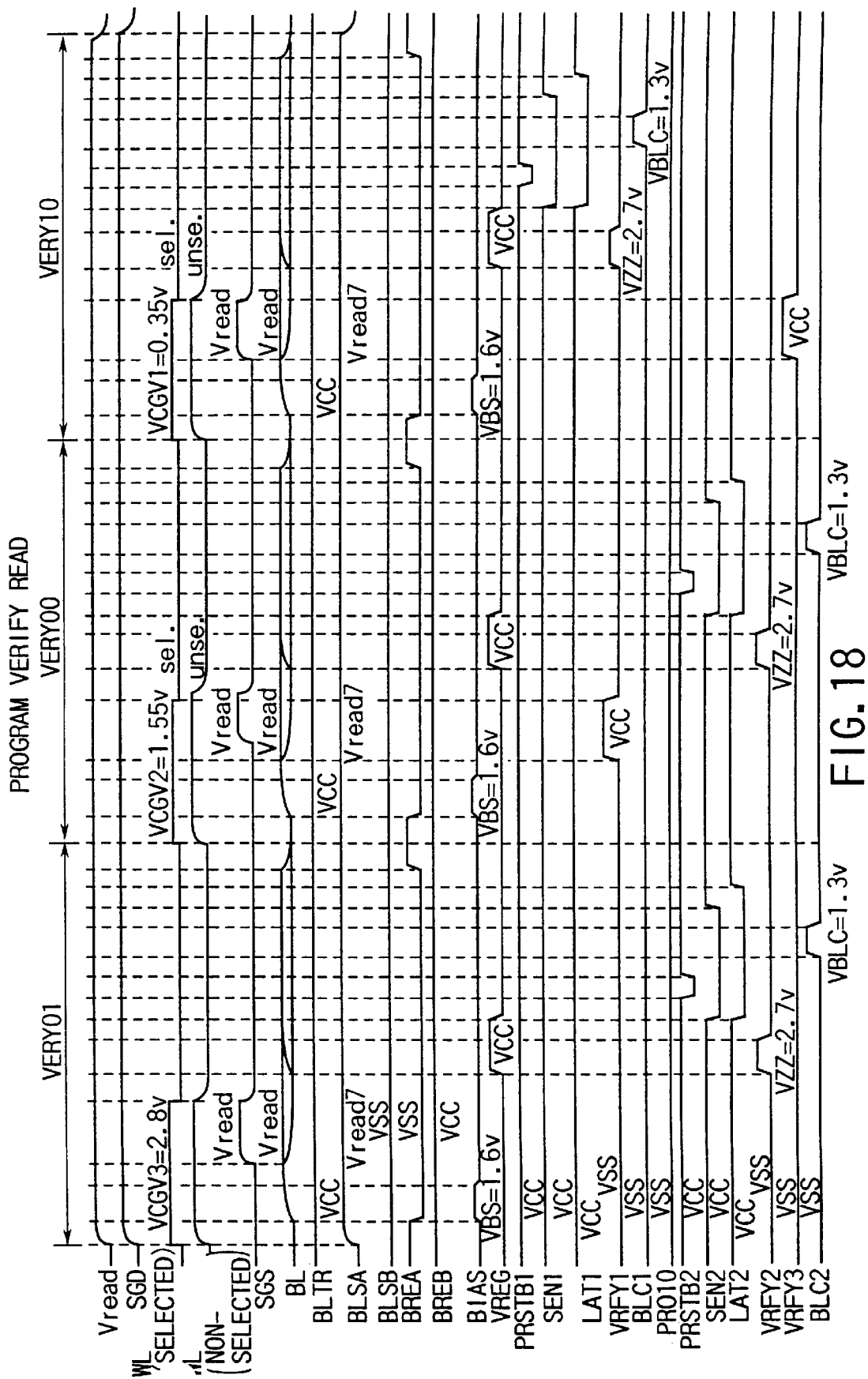
FIG. 18 is a timing chart showing the program verify operation.

FIG. 18 shows a timing chart pertaining to the program verify read operation, and FIG. 19A and 19B show the program algorithm.

First, the program number IWT is set to "0" (Step ST1). Data corresponding in amount to one page (corresponding to 4224 bits) is loaded from the data latch circuits (Step ST2). After this, the above-mentioned program operation is executed (Steps ST3 to ST5).

Further, while a program operation is being carried out, it is checked whether or not there exist memory cells to which "3", "2", "1" program is to be made, on the basis of the data loaded at Step ST2.

In case there exist memory cells to which "3" program is to be made, FRO1 is set to "H", while, in case there exists no memory cell to which "3" program is to be made, FRO1 is set to "L". Similarly, in case there exist memory cells to which "2" program is made, FR00 is set to "H", while, in case there exists no memory cell to which "2" program is to be made, FRO0 is set to "L". In case there exist memory cells to which "1" program is to be made, FR10 is set to "H", while, in case there exists no memory cell to which "1" program is to be made, FRI0 is set to "L" (Step ST5).

In case there exists no memory cell to which "3" program is to be made (in case FRO1="L"), verify VERYO1 as to whether the threshold value of the data 3" is reached or not is not executed (Step ST6).

Further, in case there exists no memory cell to which "2" program is to be made (FR00 is "L"), there is not executed verify VERY00 as to whether the threshold value of the data "2" is reached or not (Step ST9).

Further, in case there exists no memory cell to which "1" program is to be made (FR10="L"), verify VERY10 as to whether the threshold value of the data "1" is reached or not is not executed (Step ST12).

On the other hand, in case there exist memory cells to which "3", "2", "1" program are to be made (in case FR01, FR00, FR10="H"), verify VERY01, VERY00, VERY10 as to whether the threshold value of the data "3", "2", "1" is reached or not is executed (Steps ST 6, 9 and 12).

Before the respective verify VERY01, VERY00, VERY10 are executed, the above-mentioned program operation is executed nine times repeatedly (Steps ST7, ST10, and ST13). This is because, at the beginning, the program of the memory cells is not sufficient.

Further, after the step of executing only the verify VERY00 and VERY10 repeatedly five times (IWT 10 to 14), the step of executing the verify VERY10, VERY00 and VERY10 is carried out (IWT 15 to 44). When the program number IWT reaches 45, it is decided that the program is abnormal, and thus, the program is terminated (Step ST16).

The verify operations will each be described in detail below.

* VERY01

It is verified whether or not the memory cells have reached the threshold value of the data "3".

This operation is the same as that of READ01 when the read operation is performed, but, in order to provide a margin to the potential applied to the select word line, about 2.8V is applied to the selected word line. After the data in the memory cells is read out onto the bit line, VERY2 is made to about 2.7v, and VREG is made to "H" (VCC) in connection with FIG. 9, and, in case the data latched in the second sub-data circuits is "0", electric charges are fed to the bit line so that the data in the second sub-data circuits can become "0".

Only when the data which has been latched in the second sub-data circuits is "1", the data in the bit line is read into the second sub-data circuits. Due to this, in case the data in the memory cells is the state of "3", the bit line is in "H" level, so that the data in the second sub-data circuits becomes "0".

In other words, as shown in Table 4, the data latched in the first and second sub-data circuits both alike become "0", so that no program is executed after this.

In case the data in the memory cells has not become "3", the bit lines are "L" in level, so that the data in the second sub-data circuits remains "1". Thus, as shown in Table 4, the program of the data "3" to the memory cells is repeatedly performed.

In case of executing the program of data "2" into the memory cells, also, the data in the second sub-data circuits is "1", and thus, the data in the bit line is read into the second sub-data circuits. However, with respect to those memory cells to which the "2" program is immediately completed (during IWT10 to 14), nothing matters since the second sub-data is "0".

Further, those memory cells to which the "2" program is not terminated at IWT10 to 14 are slow in program speed, so that the threshold value thereof becomes lower than the threshold value of the data "3", without fail. Thus, the memory cells are turned on, so that the bit line becomes "L" in level, and the data in the second sub-data circuits remains "1".

TABLE 4

| Program state of memory cells | Data latch circuit | |
|---|---|---|
| | Control data before program verify | Control data after program verify |
| 0, 1, 2 or 3 | 0 | 0 |
| Data 1 not programmed | 1 | 1 |
| 1 | 1 | 0 |
| Data 2 not programmed | 2 | 2 |
| 2 | 2 | 0 |
| Data 3 not programmed | 3 | 3 |
| 3 | 3 | 0 |

* VERY00

It is verified whether or not the memory cells have reached the threshold value of the data "2".

The operation is the same as that of VERY01, but the potential of the selected word line is set to about 1.55V. Further, the signal VRFY1 is set to VCC, the signal VREG is set to "L (VSS)", and, when the data in the first sub-data circuits is "0", the potential of the bit line is rendered to VSS.

Further, VRFY2 is set to about 2.7V, VREG is set to "H (VCC)", and, in case "0" is stored in the second sub-data circuits, the data in the second sub-data circuits is made to remain "0", and, in case "1" is stored in the second sub-data circuits, the potential of the bit line is put into the second sub-data circuits.

In case the data "2" is desired to be programmed into memory cells, and yet, the data in the memory cells is "2", the potential in the bit line connected to the above-mentioned memory cells becomes "H" in level. Thus, the data in the second sub-data circuits becomes "0" (the data in the first sub-data circuits is "1"), and thus, there is brought about the state in which the data "1" is to be programmed into the memory cells, as shown in Table 4.

On the other hand, when the data in the memory cells is not "2", the data in the second sub-data circuits remains "1", so that the state in which the data "2" is to be programmed into the memory cells continues.

With respect to the memory cells to which "3" program is made, the bit line is set to VSS, whereby the state of the data latch circuits is prevented from changing, that is, the data in the second sub-data circuits is prevented form shifting from "1" to "0".

* VERY10

It is verified whether or not the memory cells have reached the threshold value of the data "1".

This operation is the same as that of VERY00, but, in this case, the potential of the selected word line is set to about 0.35V. Further, the signal VRFY3 is set to VCC, and the signal VREG is set to "L (VSS)", and, when the data in the second sub-data circuits is "1" (when "2" program and "3" program are made), the potential of the bit line is rendered to VSS.

By this operation, the change in the state of the data latch circuits can be prevented with respect to the memory cells to which "2" program and "3" program are made.

VRFY1 is set to about 2.7V, VREG is set to "H (VCC)", and, in case "0"; is stored in the first sub-data circuits, the data in the first sub-data circuits is left as it is "0", but, in case "1" is stored in the first sub-data circuits, the potential in the bit line is put into the first sub-data circuits.

In case the data "1" is desired to be programmed into memory cells, and yet, the data in the memory cells is "1", the potential in the bit line is set to "H" in level. Due to this, the data in the first sub-data circuits becomes "0", so that, as shown in Table 4, the program of the data "0" into the memory cells ceases to be effected.

On the other hand, when the data in the memory cells is not "1", the data in the first sub-data circuits becomes "1", so that the program of the data "1" into the memory cells is continued.

To those memory cells to which "2" program is made, the potential of the bit line is rendered to VSS as mentioned above, so that the state of the data latch circuits remains invariable.

Program verify is performed by the above-mentioned operation.

That is, if predetermined data (a predetermined threshold value) is accurately programmed into the memory cells, the data in the first or second sub-data circuits is rendered to "0" (data the program of which is not made). When the predetermined data (predetermined threshold value) is not accurately programmed in the memory cells, the state of the respective sub-data circuits is not changed, and program is executed again.

Further, in case the program of the data "3" or "1" is made to all the memory cells, only the data verify with respect to "3" program or only the data verify with respect to the "1" program is executed.

However, when the program of only the data "2" is made to all the memory cells, data verify for the "2" program and data verify for the "1" program are executed. This is because, after the data verify for the "2" program, the state of the data latch circuits becomes the state for "1" program (the first sub-data circuits become "1", while the second sub-data circuits become "0").

(4) Erase Operation

The erase operation is carried out by the unit of blocks. Further, it is carried out at the same time with respect to the two bit lines Bli, Bli+1 connected to the data latch circuits.

Figure 20:
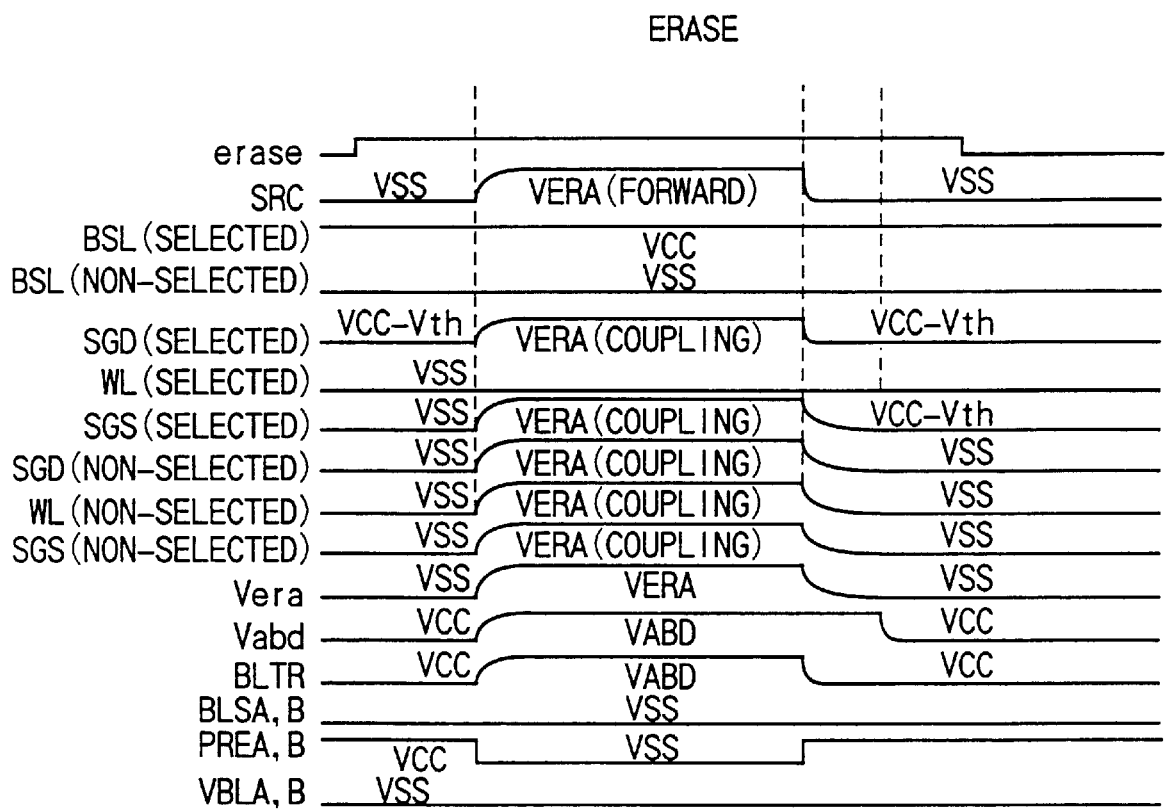
FIG. 20 is a timing chart showing the erase operation.

FIG. 20 shows a timing chart pertaining to the erase operation.

By an external address, the block in which erase is to be executed (selected block) is determined, and all the word lines in the thus selected block are rendered to VSS, while all the word lines in the blocks in which no erase is executed (non-selected blocks) are brought into a floating state. Further, because of BLSA="L", BLSB="L", PREA="L", and PREB="L", so that all the bit lines are brought into a floating state.

Here, if an erase voltage VERA (about 20V) is applied to the well in which the memory cells are formed, then there is carried out an erase operation in which positive charges are injected into the floating gate electrode. If the erase operation is normally carried out, the data in the memory cells become "0".

Figure 21:
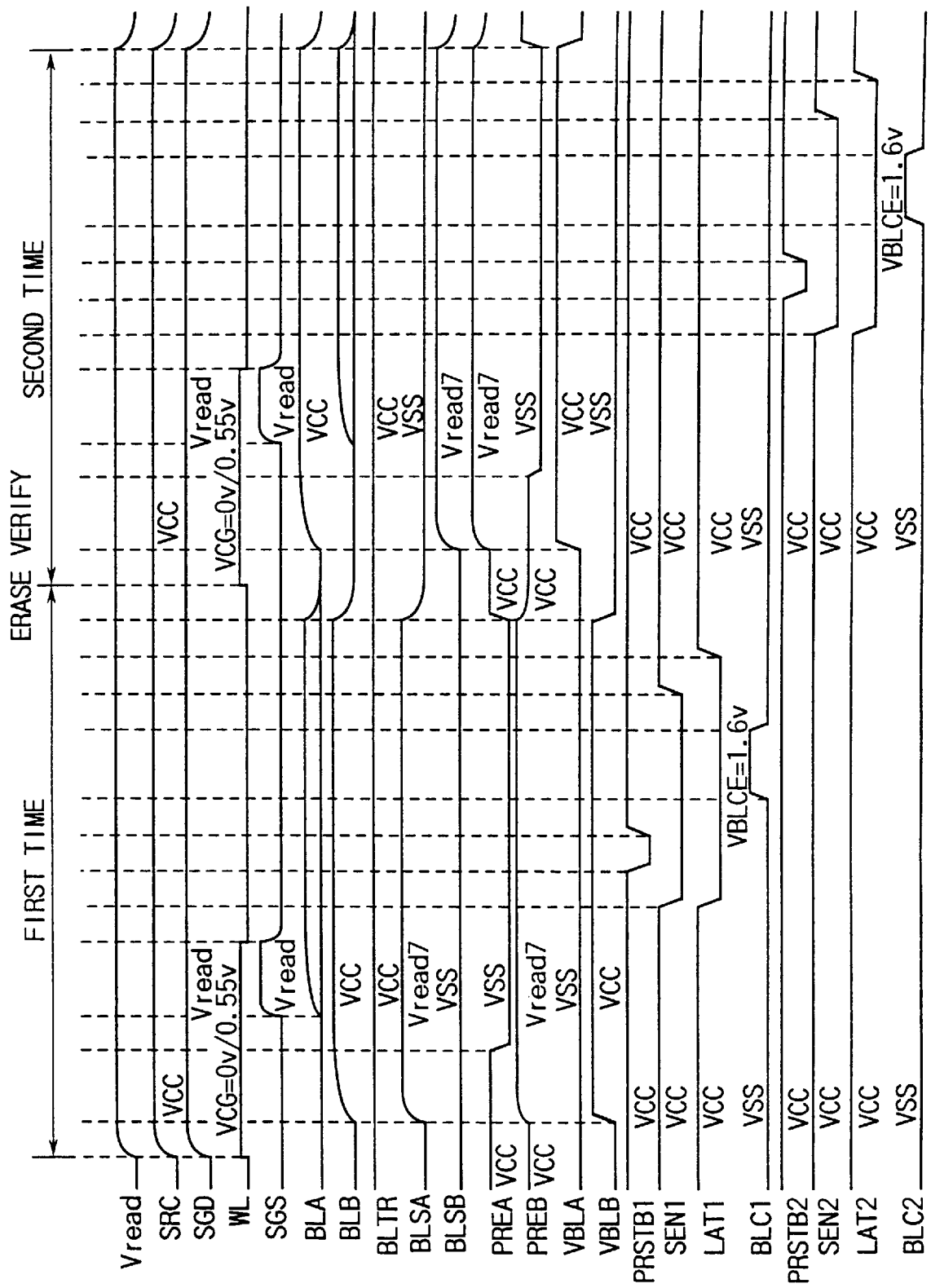
FIG. 21 is a timing chart showing the erase verify operation.

(5) Erase Verify Operation (Erase Verify):

FIG. 21 is a timing chart pertaining the erase verify operation.

The erase verify operation is carried out as follows: By the first step of the operation, verify read is made with respect to one of the two bit lines Bli, Bli+1 connected to the data latch circuits, and the result obtained is latched in the first sub-data circuits. Further, by the next step of the operation, verify read is made with respect to the other one of the two bit lines Bli, Bli+1 connected to the data latch circuits, and the result obtained is latched in the second sub-data circuits.

If it is decided that the threshold value of the memory cells connected to one of the two bit lines Bli, Bli+1 is below a reference value (0V), then "0" data enters the first sub-data circuits (verify is OK), but, if it is decided that the above-mentioned threshold value is higher than the reference value (0V), then "1" data enters the first sub-data circuit (verify is NG).

Similarly, if it is decided that the threshold value of the memory cells connected to the other one of the two bit lines Bli, Bli+1 is below the reference value (0V), then "0" data enters the second sub-data circuits (verify is OK), but, if it is decided that the above-mentioned threshold value is higher than the reference value (0V), then "1" data enters the second sub-data circuits (verify is NG).

(6) 2-level to 4-level Changeover Operation

In the multi-level NAND flash EEPROM, the memory cell array is comprised of a main area, a spare area and a redundancy area as shown in FIG. 7 for example. In the main area, normal bits are stored, and, in the spare area, redundant bits are stored. The redundancy area is provided for relieving the defective bits in the main area or the spare area.

In this embodiment, 4-level data is stored in the memory cells of the main area in order to increase the memory capacity thereof, and 2-level data is stored in the memory cells of the spare area in order to secure the reliability even if the rewrite number is large.

Table 5 and Table 6 show the operation performed by the column decoder when read or program is made from or to the memory cells (4-level/cells) in the main area. Table 5 and Table 6 can also be applied to the case where 4-level data is stored in the spare area.

TABLE 5

| A4 | A3 | A2 | A1 | YA0 | YA1 | YA2 | YA3 | YA4 | YA5 | YA6 | YA7 | YA8 | YA9 | YA10 | YA11 | YA12 | YA13 | YA14 | YA15 |
|---|---|---|---|---|---|---|---|---|---|---|---|---|---|---|---|---|---|---|---|
| L | L | L | L | H | | | | | | | | | | | | | | | |
| L | L | L | H | | H | | | | | | | | | | | | | | |
| L | L | H | L | | | H | | | | | | | | | | | | | |
| L | L | H | H | | | | H | | | | | | | | | | | | |
| L | H | L | L | | | | | H | | | | | | L | | | | | |
| L | H | L | H | | | | | | H | | | | | | | | | | |
| L | H | H | L | | | | | | | H | | | | | | | | | |
| L | H | H | H | | | | | | | | H | | | | | | | | |
| H | L | L | L | | | | | | | | | H | | | | | | | |
| H | L | L | H | | | | | | | | | | H | | | | | | |
| H | L | H | L | | | | | | | | | | | H | | | | | |
| H | L | H | H | | | | | | | | | | | | H | | | | |

TABLE 5-continued

| A4 | A3 | A2 | A1 | YA0 | YA1 | YA2 | YA3 | YA4 | YA5 | YA6 | YA7 | YA8 | YA9 | YA10 | YA11 | YA12 | YA13 | YA14 | YA15 |
|---|---|---|---|---|---|---|---|---|---|---|---|---|---|---|---|---|---|---|---|
| H | H | L | L |   |   |   |   | L |   |   |   |   |   |   |   | H |   |   |   |
| H | H | L | H |   |   |   |   |   |   |   |   |   |   |   |   |   | H |   |   |
| H | H | H | L |   |   |   |   |   |   |   |   |   |   |   |   |   |   | H |   |
| H | H | H | H |   |   |   |   |   |   |   |   |   |   |   |   |   |   |   | H |

Main area (in case of 4-level/cell)
YAi is YAbi or YAti (determined by A0)
Spare area (in case of 4-level/cell)
YAi is YARbi or YARti (determined by A0)
YRb or YRt (determined by A0) is "H"

TABLE 6

| A8 | A7 | A6 | A5 | YB0 | YB1 | YB2 | YB3 | YB4 | YB5 | YB6 | YB7 | YB8 | YB9 | YB10 | YB11 | YB12 | YB13 | YB14 | YB15 |
|---|---|---|---|---|---|---|---|---|---|---|---|---|---|---|---|---|---|---|---|
| L | L | L | L | H |   |   |   |   |   |   |   |   |   |   |   |   |   |   |   |
| L | L | L | H |   | H |   |   |   |   |   |   |   |   |   |   |   |   |   |   |
| L | L | H | L |   |   | H |   |   |   |   |   |   |   |   |   |   |   |   |   |
| L | L | H | H |   |   |   | H |   |   |   |   |   |   |   |   |   |   |   |   |
| L | H | L | L |   |   |   |   | H |   |   |   |   |   | L |   |   |   |   |   |
| L | H | L | H |   |   |   |   |   | H |   |   |   |   |   |   |   |   |   |   |
| L | H | H | L |   |   |   |   |   |   | H |   |   |   |   |   |   |   |   |   |
| L | H | H | H |   |   |   |   |   |   |   | H |   |   |   |   |   |   |   |   |
| H | L | L | L |   |   |   |   |   |   |   |   | H |   |   |   |   |   |   |   |
| H | L | L | H |   |   |   |   |   |   |   |   |   | H |   |   |   |   |   |   |
| H | L | H | L |   |   |   |   |   |   |   |   |   |   | H |   |   |   |   |   |
| H | L | H | H |   |   |   |   |   |   |   |   |   |   |   | H |   |   |   |   |
| H | H | L | L |   |   |   |   | L |   |   |   |   |   |   |   | H |   |   |   |
| H | H | L | H |   |   |   |   |   |   |   |   |   |   |   |   |   | H |   |   |
| H | H | H | L |   |   |   |   |   |   |   |   |   |   |   |   |   |   | H |   |
| H | H | H | H |   |   |   |   |   |   |   |   |   |   |   |   |   |   |   | H |

Main area (in case of 4-level/cell)
YBi is YBbi or YBAti (determined by A0)

In the main area, one data latch circuit is selected (for example, YAbo="H" and YBbo="H", while all the others are "L") for one address (for example, A1, A2, ... A8="L, L, ... L"), and, in one data latch circuit, 2-bit (4-level) data is latched.

For example, at the time of read, data corresponding to one page which has been read simultaneously is latched in the data latch circuits in the main area and serially outputted to the outside of the chip, as shown in Table 5 and Table 6, by changing the addresses A1 to A8. Further, at the time of program, by changing the addresses A1 to A8 as shown in Table 5 and Table 6, data corresponding to one page are successively latched in the data latch circuits and, at the same time, data corresponding to one page is programmed into the memory cells.

Table 7 shows the operation performed by the column decoder when read or program is made from or to the memory cells (2-level/cells) in the spare area. Table 7 and Table 8 can also be applied to the operation performed in case 2-level data is stored in the memory cells in the main area.

TABLE 7

| A4 | A3 | A2 | A1 | YA0 | YA1 | YA2 | YA3 | YA4 | YA5 | YA6 | YA7 | YA8 | YA9 | YA10 | YA11 | YA12 | YA13 | YA14 | YA15 |
|---|---|---|---|---|---|---|---|---|---|---|---|---|---|---|---|---|---|---|---|
| L | L | L | L | H | H |   |   |   |   |   |   |   |   |   |   |   |   |   |   |
| L | L | L | H | H | H |   |   |   |   |   |   |   |   |   |   |   |   |   |   |
| L | L | H | L |   |   | H | H |   |   |   |   |   |   |   |   |   |   |   |   |
| L | L | H | H |   |   | H | H |   |   |   |   |   |   |   |   |   |   |   |   |
| L | H | L | L |   |   |   |   | H | H |   |   |   |   |   |   | L |   |   |   |
| L | H | L | H |   |   |   |   | H | H |   |   |   |   |   |   |   |   |   |   |
| L | H | H | L |   |   |   |   |   |   | H | H |   |   |   |   |   |   |   |   |
| L | H | H | H |   |   |   |   |   |   | H | H |   |   |   |   |   |   |   |   |
| H | L | L | L |   |   |   |   |   |   |   |   | H | H |   |   |   |   |   |   |
| H | L | L | H |   |   |   |   |   |   |   |   | H | H |   |   |   |   |   |   |
| H | L | H | L |   |   |   |   |   |   |   |   |   |   | H | H |   |   |   |   |
| H | L | H | H |   |   |   |   |   |   |   |   |   |   | H | H |   |   |   |   |
| H | H | L | L |   |   |   |   | L |   |   |   |   |   |   |   | H | H |   |   |
| H | H | L | H |   |   |   |   |   |   |   |   |   |   |   |   | H | H |   |   |

TABLE 7-continued

| A4 | A3 | A2 | A1 | YA0 | YA1 | YA2 | YA3 | YA4 | YA5 | YA6 | YA7 | YA8 | YA9 | YA10 | YA11 | YA12 | YA13 | YA14 | YA15 |
|----|----|----|----|----|----|----|----|----|----|----|----|----|----|----|----|----|----|----|----|
| H | H | H | L |  |  |  |  |  |  |  |  |  |  |  |  |  |  | H | H |
| H | H | H | H |  |  |  |  |  |  |  |  |  |  |  |  |  |  | H | H |

Main area (in case of 2-level/cell)
YAi is YAbi or YAti (determined by A0)
Spare area (in case of 2-level/cell)
YAi is a YARbi or YARti (determined by A0)
YRb or YRt (determined by A0) is "H"

TABLE 8

| A8 | A7 | A6 | A5 | YB0 | YB1 | YB2 | YB3 | YB4 | YB5 | YB6 | YB7 | YB8 | YB9 | YB10 | YB11 | YB12 | YB13 | YB14 | YB15 |
|----|----|----|----|----|----|----|----|----|----|----|----|----|----|----|----|----|----|----|----|
| L | L | L | L | H |  |  |  |  |  |  |  |  |  |  |  |  |  |  |  |
| L | L | L | H |  | H |  |  |  |  |  |  |  |  |  |  |  |  |  |  |
| L | L | H | L |  |  | H |  |  |  |  |  |  |  |  |  |  |  |  |  |
| L | L | H | H |  |  |  | H |  |  |  |  |  |  |  |  |  |  |  |  |
| L | H | L | L |  |  |  |  | H |  |  |  |  |  | L |  |  |  |  |  |
| L | H | L | H |  |  |  |  |  | H |  |  |  |  |  |  |  |  |  |  |
| L | H | H | L |  |  |  |  |  |  | H |  |  |  |  |  |  |  |  |  |
| L | H | H | H |  |  |  |  |  |  |  | H |  |  |  |  |  |  |  |  |
| H | L | L | L |  |  |  |  |  |  |  |  | H |  |  |  |  |  |  |  |
| H | L | L | H |  |  |  |  |  |  |  |  |  | H |  |  |  |  |  |  |
| H | L | H | L |  |  |  |  |  |  |  |  |  |  | H |  |  |  |  |  |
| H | L | H | H |  |  |  |  |  |  |  |  |  |  |  | H |  |  |  |  |
| H | H | L | L |  |  |  |  | L |  |  |  |  |  |  |  | H |  |  |  |
| H | H | L | H |  |  |  |  |  |  |  |  |  |  |  |  |  | H |  |  |
| H | H | H | L |  |  |  |  |  |  |  |  |  |  |  |  |  |  | H |  |
| H | H | H | H |  |  |  |  |  |  |  |  |  |  |  |  |  |  |  | H |

Main area (in case of 2-level/cell)
YBi is YBbi or YBti (determined by A0)

In the spare area, 1-bit (2-level) data is stored in one data latch circuit, so that one address (for example, A1, A2, A3, A4="L, L, L, L") is determined, two data latch circuits are selected (for example, YARb0="H", YARb1="H", and YRb="H", while the others are all "L").

For example, the data corresponding to one page which has been simultaneously read at the time of read is latched in the data latch circuits in the spare area and outputted to the outside of the chip by the unit of two bits, as shown in Table 7, by changing the addresses A1 to A4. Further, at the time of program, the data is transferred by the unit of 2 bits to the data latch circuits, as shown in Table 7, by changing the addresses A1 to A4 and, at the same time, the data corresponding to one page is programmed into the memory cells.

Further, in case of storing 1-bit (2-level) data in the memory cells in the main area, the transfer of the data is effected by the unit of two bits at the same time between the data input/output buffer and the two data latch circuits as shown in Table 7 and Table 8. In this case, in the main area, 1-bit (2-level) data is stored in one data latch circuit, and, when one address (for example, A1, A2, . . . A="L, L, . . . L") is determined, two data latch circuits are selected (for example, YAb0="H", YAb1="H", and YBb0="H", while the others are all "L").

In the redundancy area, the same operation as in the main area is performed when the memory cells in the main area are replaced, and the same operation as in the spare area is performed when the memory cells in the spare area are replaced.

However, those memory cells in the spare in which 2-level data is stored are replaced, two data latch circuits are used as a set, so that the memory cells are replaced with every two data latch circuits.

The plurality of data latch circuits in the main area, the spare area and the redundancy area are connected to the data input/output buffer through three data lines IOB1, IOB2, IOB3 or three data lines IOT1, IOT2, IOT3. In this case, by the address A0, either the data lines IOB1, IOB2, IOB3 or the data lines IOT1, IOT2, IOT3 are selected.

In case 2-bit (4-level) data is inputted and outputted through one data latch circuit in the main area, for example two data lines IOB1, IOB2 or two data lines IOB1, IOB3 are used. Further, in case 1-bit (2-level) data is inputted and outputted through two data latch circuits in the spare area, for example the data line IOB2 is used for the data in one of the data latch circuits, while the data line IOB3 is used for the data in the other data latch circuit.

As shown in FIGS. 10 to 12, the data lines IOB1, IOB2, IOB3, IOT1, IOT2, IOT3 are connected to the data input/output buffer, and for example 2-bit data PD0, PD1 are led to two input/output terminals I/O0, I/O1 from the data input/output buffer, respectively.

Next, the operations performed when read is made, when program is made, and when program verify is made will be described below. Hereinafter, it is to be assumed that the case where the main area, the spare area or the redundance area is used with 4-level/cells is referred to as 4-level mode, while the case where the main area, the spare area or the redundancy area is used with 2-level/cells is referred to as 2-level mode.

Referring to FIGS. 10 to 12 or FIGS. 13 to 15, a signal Double becomes "L" in the 4-level mode and becomes "H" in the 2-level mode.

When a read operation is performed, "11", "01", "00", "10" are outputted from the data latch circuit in response to the data "0", "1", "2" "3" in the memory cells in case of the 4-level mode (See Table 2).

Figure 22:
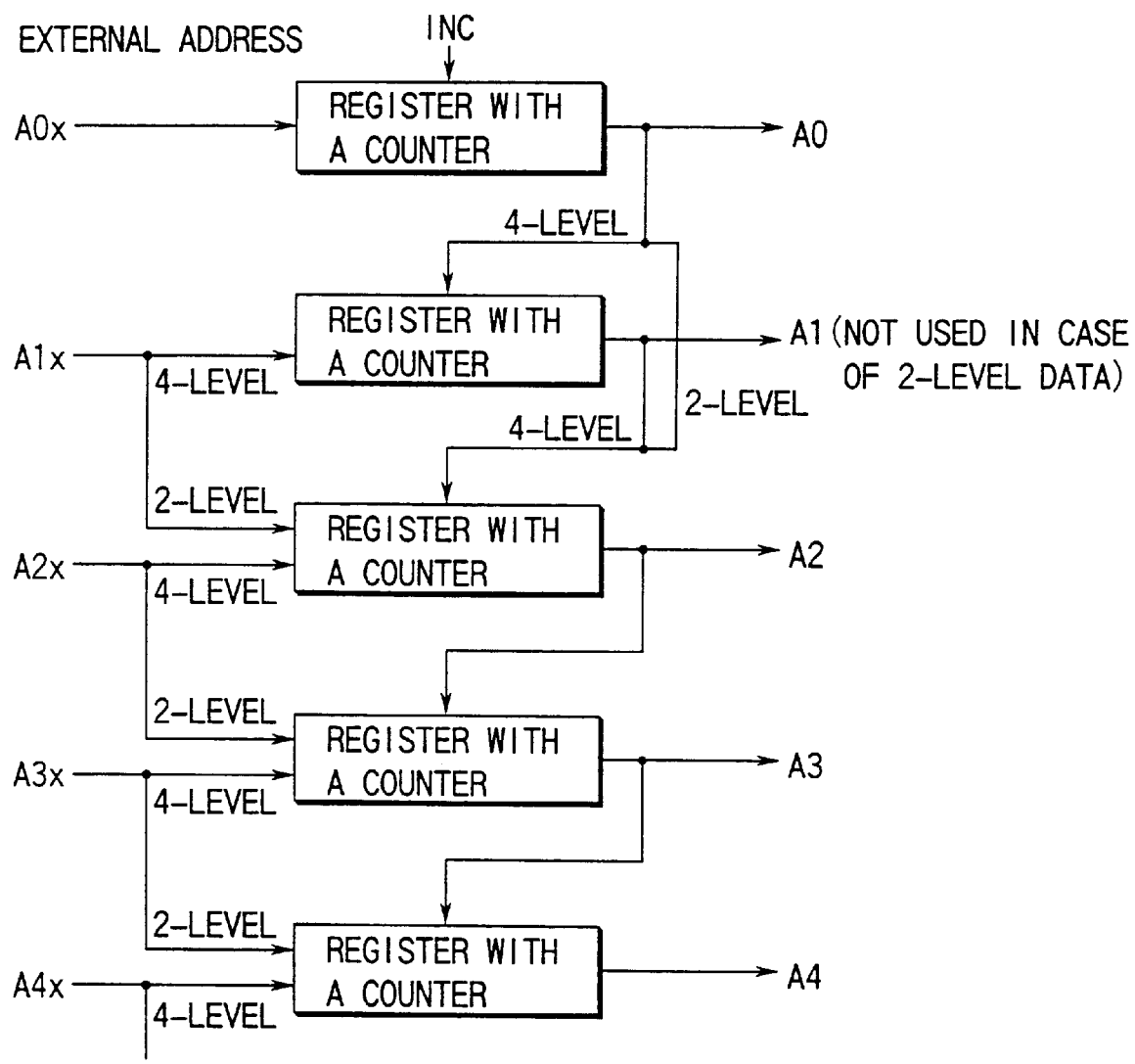
FIG. 22 is a schematic diagram showing the address counter.
Figure 23:
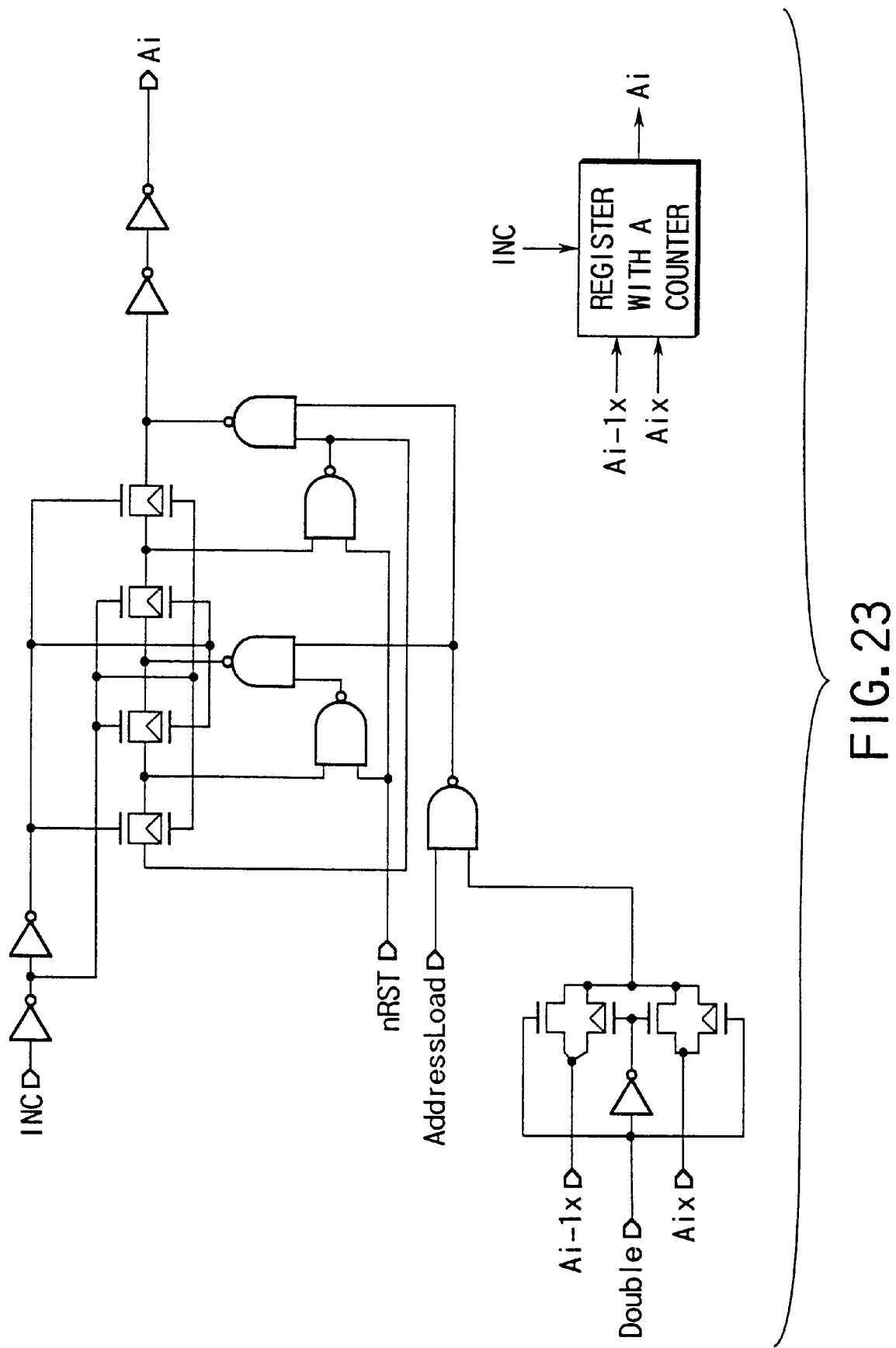
FIG. 23 is a circuit diagram showing in detail a register with a counter shown in FIG. 22.

Next, when the column address is determined, external addresses A0x to A8x are read into the registers by the circuit shown in FIG. 22 and FIG. 23, thus determining A0 to A8 (See Table. 9).

TABLE 9

| When address is read in | | |
|---|---|---|
| External address | 4-level mode | 2-level mode |
| A0x | A0 | A0 |
| A1x | A1 | A2 |
| A2x | A2 | A3 |
| A3x | A3 | A4 |
| A4x | A4 | A5 |
| A5x | A5 | A6 |
| A6x | A6 | A7 |
| A7x | A7 | A8 |
| A8x | A8 | |

Increment
4-level: A0 → A1 → A3 . . . A8
2-level: A0 → A2 → A3 . . . A8

Further, on the basis of Table 5 and Table 6, YAi, YBi, etc. are determined; and thus, one data latch circuit is selected. Referring to the circuit shown in FIGS. 10 to 12, the signal Double is "L", so that the 2-bit (4-level) data in one data latch circuit is passed through the data lines IOB1 to IOB3 or the data lines IOT1 to IOT3 and rendered into signals PD0, PD1, which are outputted from the output stages I/O0, I/O1.

For example, the data in the second sub-data circuit LATCH2 is passed through the data line IOB1 or the date line IOT1 and outputted as signal PD1. The data in the first sub-data circuit LATCH1 is passed through the data line IOB2, the data line IOB3, the data line IOT2 or the data line IOT3 and outputted as signal PD0.

Here, it is added that, when the address A1 is "L", the data in the first sub-data circuit LATCH1 is passed through the data line IOB2 or the data line IOT2 and outputted as signal PD0. When the address A1 is "H", the data in the first sub-data circuit LATCH1 is passed through the data line IOB3 or the data line IOT3 and outputted as signal PD0.

The selection between the data line IOB1 to IOB3 side and the data line IOT1 to IOT3 side is effected through the address A0. In case serial read is made without putting address newly, the address value is incremented in the order of A1, A2, A3, . . . with A0 as the least significant position, as shown in FIG. 9.

In case of the 2-level mode, the data in the memory cells is outputted as "1", "01" in accordance with "0", "1". When the column address is determined, the external addresses A0x to A7x are read into the registers by the circuit shown in FIG. 22 and FIG. 23, thus determining the addresses A0, A2 to A8 (see Table 9).

Further, on the basis of Table 7 and Table 8, YAi, YBi, etc. are determined, and thus, two data latch circuits are selected. In the circuit shown in FIGS. 10 to 12, the signal Double is "H", so that the 1-bit (2-level) data in the two data latch circuits are respectively passed through the data lines IOB1 to IOB3 or the data line IOT1 to IOT3 and outputted as signals PD0, PD1 from the output terminals I/O0, I/O1.

For example, the second sub-data circuits LATCH2 of the two data latch circuits are respectively connected in common to the data line IOB1 or the data line IOT1. The first sub-data circuit LATCH1 of one data latch circuit is connected to the data line IOB2 or the data line IOT2, while the first sub-data circuit LATCH1 of the other data latch circuit is connected to the data line IOB3 or the data line IOT3.

Selection between the data lines IOB1 to IOB3 side and the data lines IOT1 to IOT3 side is made through the address A0. In case a serial read operation is carried out without entering addresses newly, the address value is incremented in the order of A2, A3, with A0 as the least significant position, jumping over A1, as shown in FIG. 9.

The program operation is executed in such a manner that, first, the states of all the latch circuits are rendered into "00", thus bringing about a state in which no program is made. After this, data corresponding to one page is put into the data latch circuits. In the 4-level mode, the data latch circuits are rendered into "00", "10", "11", "01", respectively, when the data "0", "1", "2", "3" are programmed into the memory cells (See Table 3).

Figure 13:
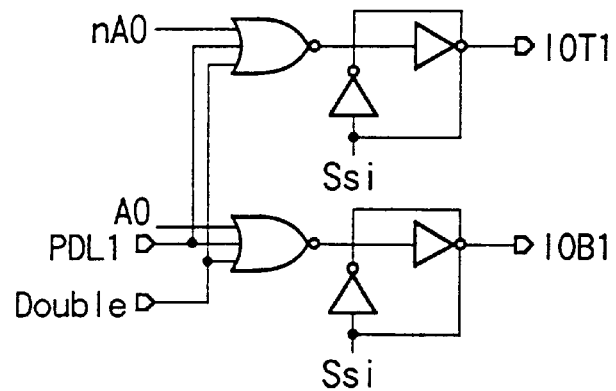
FIG. 13 is a schematic diagram showing a portion of the input route of the data input/output buffer shown in FIG. 6.
Figure 14:
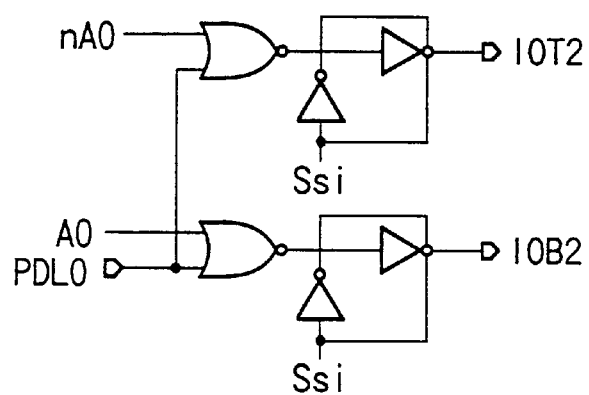
FIG. 14 is a schematic diagram showing a portion of the input route of the data input/output buffer shown in FIG. 6.
Figure 15:
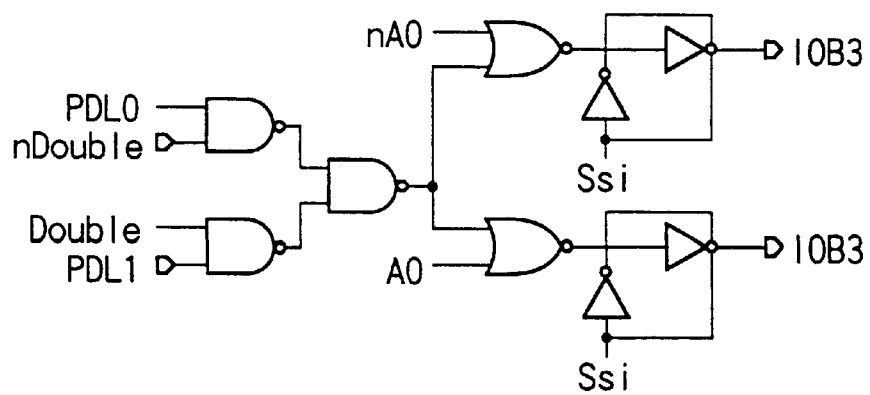
FIG. 15 is a schematic diagram showing a portion of the input route of the data input/output buffer shown in FIG. 6.

For example, as shown in FIGS. 13 to 15, program data PDL0, PDL1 is inputted from outside of the chip. A signal Ssi is normally "L" but becomes "H" when the operation mode is shifted to the data input mode. In case of the 4-level mode, the signal Double is "L", so that the data PDL1 is led to the data line IOB1 or the data line IOT1, while the data PDL0 is led to the data line IOB2, the data line IOB3, the data line IOT2 or the data line IOT3.

In case of the 4-level mode, when the column address is determined, YAi and Ybi are determined as shown in Table 5 and Table 6, so that one data latch circuit is selected. In the thus selected data latch circuit, for example the data PDL1 is inputted, to the second sub-data circuit thereof, while, to the first sub-data circuit, the data PDL0 is inputted.

On the other hand, in case of the 2-level mode, data "0" or "1" is programmed into the memory cells. Due to this, the data latch circuit is rendered into "00", "10" (See Table 3).

For example, as shown in FIGS. 13 to 15, program data PDL0, PDL1 are inputted from outside of the chip. The signal Ssi is "H", and the operation mode is the 2-level mode, so that the signal Double becomes "H"; and thus, the data PEL1 is led to the data line IOB3 or the data line IOT3, while the data PDL0 is led to the data line IOB2 or the data line IOT2. The data lines IOBI, IOTI are always kept "H" in level.

The operation mode is the 2-level mode, so that, when the column address is determined, YAi, YAi+1 and YBi become "H", and thus, the two data latch circuits are selected. To the first sub-data circuit of one data latch circuit, the data PDL0 is fed, while, to the first sub-data circuit of the other data latch circuit, the data PDL1 is applied.

Further, to the second sub-data circuits of the two data latch circuits, the potential ("H") of the data IOB1, IOT1 is inputted, respectively.

Here, the data lines IOB1, IOT1 are always kept in H" level, so that, the node Nai in the second sub-data circuit shown in FIG. 9 becomes "L" and thus, the data "0" is fed thereto. In the data input mode, OSAC becomes "L", and nOSAC becomes "H", so that the clocked inverter does not operate. Accordingly, inputted to the data latch circuit are "00" and "10".

The program verify is carried out in such a manner that, after the program operation, a read operation is executed, and, if it is decided that the threshold value of the memory cells has reached a predetermined value, the data latch circuit is rendered to "00" (no program is effected). Further, the column addresses are scanned to read the data in all the data latch circuits, thus checking whether there exist insufficiently programmed memory cells (those memory cells of which the data in the data latch circuits are "10","11", "01").

Here, it is to be added that program verify is executed in case any of the data "10", "11", "01" is latched in the data latch circuit. Further, verify read is carried out three times in correspondence to the respective data "10", "11", "01", but, with respect to those memory cells in which predetermined data have been accurately programmed, no verify read is executed.

In the 4-level mode, verify read is carried out in the same manner as normal read, but, in the 2-level mode, if verify read is made in the same manner as normal read, then, to the PD0 and PD1 shown in FIGS. 10 to 12, the data "00", "10", "11""01" in the two data latch circuits come to be outputted. Due to this, in the program verify operation, scan is made by compulsorily shifting the 2-level mode to the 4-level mode. By so doing, "00" and "10", that is, the memory data "0", "1" are outputted to the PD0 and PD1.

The erase operation is carried out in the order of the designation of the block in which erase is to be executed, the erase and the verify read; and, with respect to all the memory cells, it is checked whether or not the threshold value thereof falls below a reference value (0V). This same operation is repeatedly performed until the memory cells which have threshold values exceeding the reference value (0V) become zero.

Erase verify is the step of operation performed at first, wherein verify read is made concerning one of the two bit lines Bli, Bli+1 connected to the data latch circuit, and the result obtained is fed to the first sub-data circuit. By the next step of operation, verify read is made concerning the other one of the two bit lines Bli, Bli+1, and result thus obtained is fed to the second sub-data circuit.

In case the threshold of memory cells is below the reference value (0V), the node Nai of the first or second sub-data circuit becomes "0", and thus, "0" data is latched. In case the threshold value of memory cells is higher than the reference value (0V), the node Nai of the first or the second sub-data circuit becomes "1", and thus, "1" data is latched.

The result thus obtained is read out by scanning. In case of the 4-level mode, the same operation as in the case of the normal read or the verify read is executed, but, in case of the 2-level mode, if the same operation as in case of the normal read or the verify read is executed, then the data in the first sub-data circuits of the two data latch circuits are outputted, and thus, the contents of the second sub-data circuits are not read out by scanning. Due to this, in case of the erase verify, scan is made by compulsorily rendering the 2-level mode to the 4-level mode as in case of the program verify. By so doing, the first and second sub-data are outputted to the PD0 and PD1.

Figure 24:
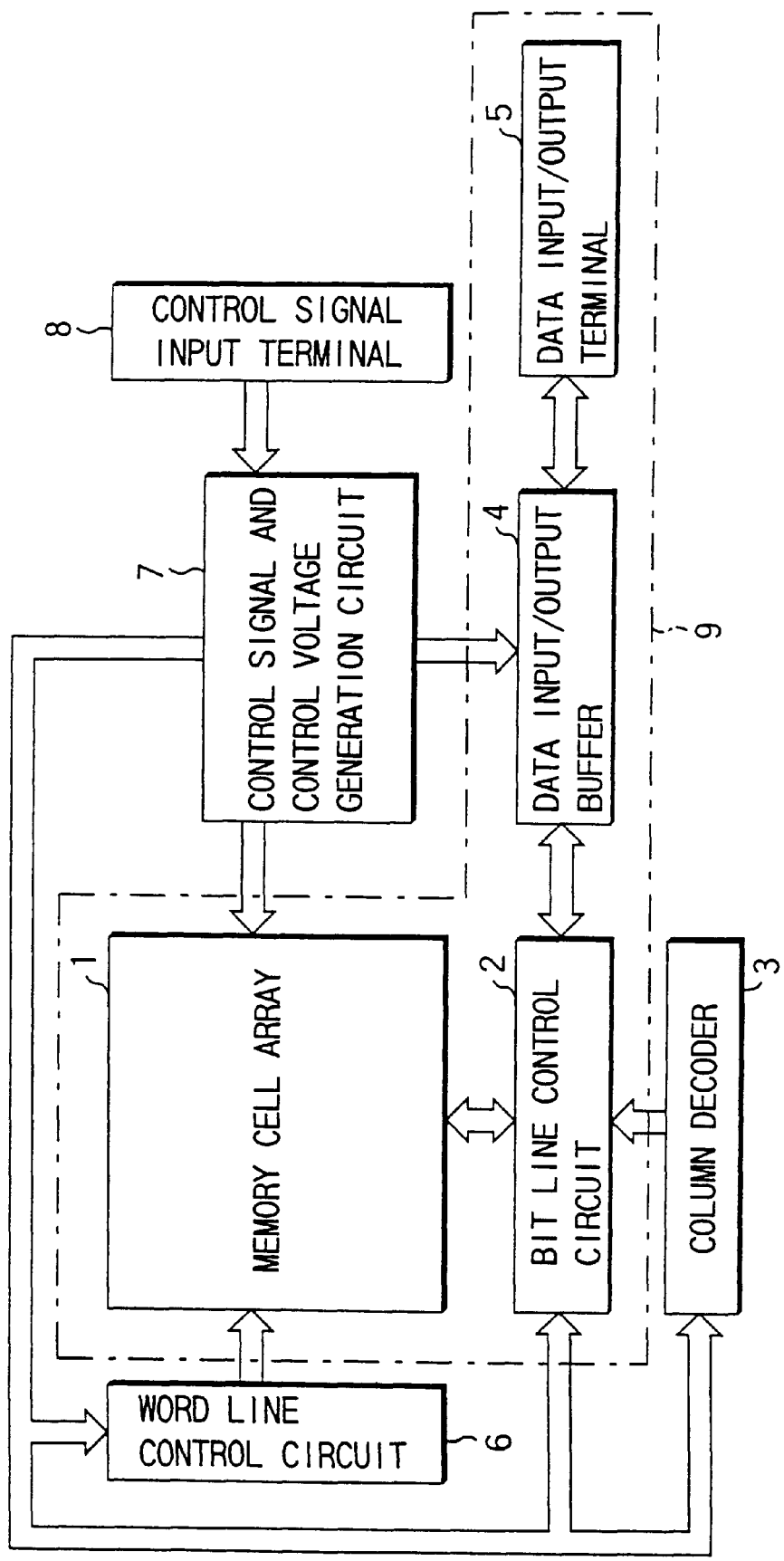
FIG. 24 is a block diagram showing the flash EEPROM according to a second embodiment of the present invention.
Figure 25:
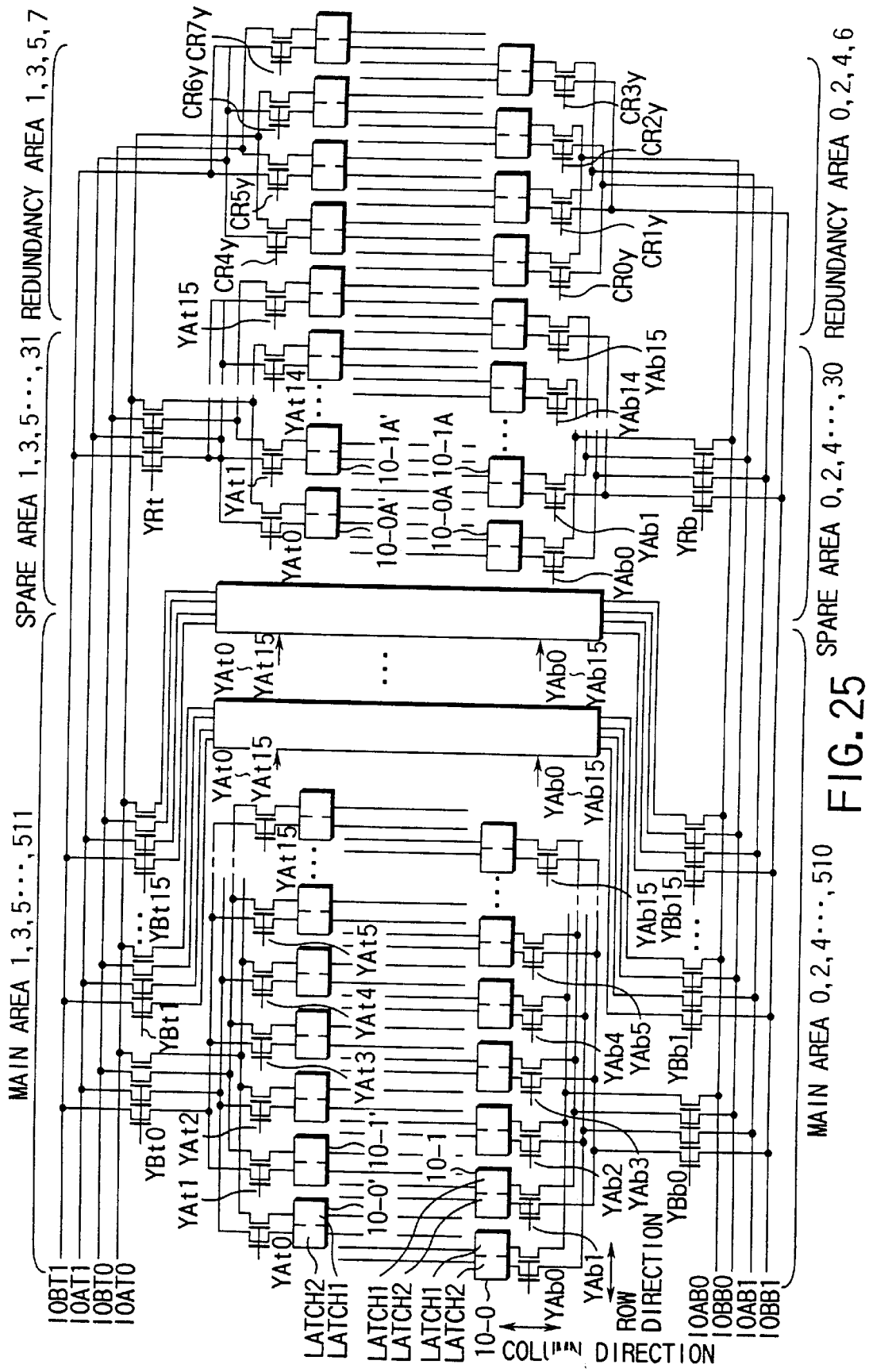
FIG. 25 is a schematic diagram showing in detail a portion of the memory cell array and a portion of the bit line control circuit.
Figure 26:
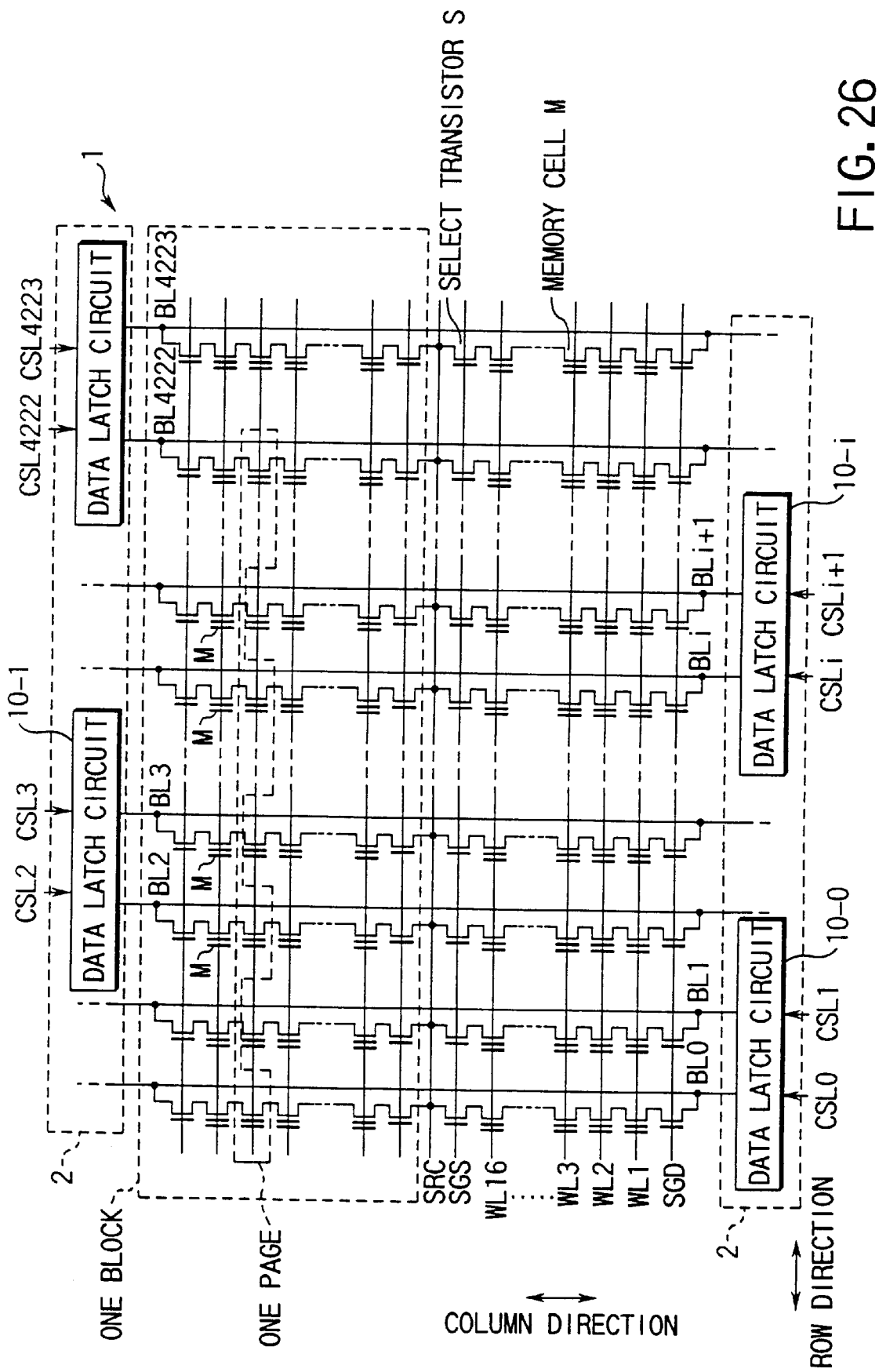
FIG. 26 is a schematic diagram showing in detail a portion of the memory cell array and a portion of the bit line control circuit shown in FIG. 24.

[C] FIG. 24 shows the essential portion of the 4-level NAND flash EEPROM according to a second embodiment of the present invention. FIG. 25 and FIG. 26 show in detail a portion of the memory cell array and a portion of the bit line control circuit shown in FIG. 24.

The memory cell array 1 includes a plurality of NAND cell units. The NAND cell units are each comprised of, for example, a NAND column comprising 16 memory cells M connected in series and select transistor S connected to both ends of the NAND column. One-side ends of the NAND cell unit are connected to the source line SRC, while the other-side ends are connected to the bit lines BL0, BL1, . . . .

Further, the memory cell array comprises a plurality of blocks, and the blocks each includes 4224 NAND cell units in the row direction. One page means the unit of data which can be read and programmed at the same time. Further, the data which are read and programmed at the same time are latched in a plurality of data latch circuits 10-0, 10-1, . . . .

The memory cell array 1 is comprised of a main area, a spare area and a redundancy area. In the main area, normal data are stored, so that, in the main area, 4-level data should desirably be stored in the memory cells M in order to increase the memory capacity thereof.

In the spare area, redundant bits are stored, so that, in the spare area, 2-level data should desirably be stored in the memory cells M in view of securing a high reliability even if the program number increases. The redundancy area is provided for relieving the defective bits in the main area or the spare area, so that, in the memory cells M thereof, 2-level or 4-level data are stored.

Disposed in the memory cell array 1 is a source line SRC which is connected in common to a plurality of word lines (control gate electrodes) WL1 to WL16, a plurality of bit lines BL0, BL1, , and a plurality of (or all) memory cells Further, disposed close to the memory cell array 1 are a bit line control circuit 2 which executes control over the potential of the bit lines BL0, BL1, . . . , etc., and a word line control circuit 6 which performs control over the potential of the word lines WL1 to WL16.

The bit line control circuit 2 is provided, for example, for outputting the data in the memory cells M in the memory cell array 1 to the outside of the chip via the bit lines BL0, BL1, . . . at the time of read, for detecting the state of the memory cells M in the memory cell array 1 at the time of verify, and for applying a program control voltage to the memory cells M in the memory cell array 1 at the time of program.

In case of this embodiment, bit line control circuits 2 are disposed at both ends in the column direction of the memory cell array 1 so as to have the memory cell array 1 interposed therebetween. The bit line control circuits 2 each include a plurality of data latch circuits 10-0, 10-1, . . . 10-$i$, . . . which can hold data corresponding to one page; and data corresponding to one page is held in the data latch circuits 10-0, 10-1, . . . 10-$i$, . . . .

The bit line control circuits 2 are disposed at both ends in the column direction of the memory cell array 1, so that the width in the row direction of the region in which the data latch circuits are disposed can be increased. As to in which one of the two bit line control circuits 2 disposed at both ends of the memory cell array 1 the data be latched, it can be decided by, e.g., the least significant address A0.

Further, the memory cells M store therein 2-bit (4-level) data as well as 1-bit (2-level) data. In this case, one data latch circuit 10-0 includes two sub-data circuits LATCH1, LATCH2 and is connected to two bit lines BL0, BL1.

Further, in each of the bit line control circuits 2, for example respective two data latch circuits adjacent to each other are formed into a set, and, in case of storing 1-bit (2-level) data in one memory cell, the transmission and reception of data is performed at the same time between the data input/output terminal 5 and the two data latch circuits in one set at the time of program and at the time of read.

On the other hand, in case of storing 2-bit (4-level) data in one memory cell, the transmission and reception of the data is performed, as in the normal case, between the data input/output terminal 5 and one data latch circuit at the time of program and at the time of read.

When program and read are made, one of the two bit lines connected to one data latch circuit 10-$i$ is selected, and, into or from the memory cells connected to the thus selected bit line, program or read is executed.

As the data lines connecting the respective bit line control circuit 2 and the data input/output buffer 4 to each other, there are four data lines (IOAB0, 1, IOBB0, 1, IOAT0, 1, IOBT0, 1). Further, the data input/output terminals 5 are two in number; and 1-bit (2-level) or 2-bit (4-level) data is inputted or outputted through these two data input/output terminals 5.

In the main area of the memory cell array 1, the transmission and reception of data between the data latch circuits 10-0, 10-1, . . . and the data input/output terminals 5 is controlled by select signals YAb0 to YAb15, YAt0 to YAt15, YBb0 to YBb15 outputted from the column decoder 3 and the data input/output buffer.

Further, in the spare area of the memory cell array 1, the transmission and reception of data between the data latch circuits of the bit line control circuits 2 and the data input/output terminals 5 is controlled by select signals YAb0 to YAb15, YAt0 to YAt15, YRB, YRt and the data input/output buffer.

Further, in the redundancy area of the memory cell array 1, the transmission and reception of data between the data latch circuits of the bit line control circuits 2 and the data input/output terminals 5 is controlled by select signals CR0y to CR7y outputted from the column decoder 3 and the data input/output buffer.

This embodiment differs from the first embodiment in that, in this embodiment, there are provided four data lines which connect the bit control circuits 2 and the data input/output buffer 4 to each other. That is, by setting the number of the data lines to 4, it becomes possible to use in common the select signals YAb0 to YAb15, YAt0 to YAt15 used for selection between the data latch circuits in the main area and the select signals YAb0 to YAb15, YAt0 to YAt15 used for selection between the data latch circuits in the spare area.

Here, it is to be noted that, if, in the first embodiment, the select signals YAb0 to YAb15, YAt0 to YAt15 were used in common, then there would arise the defect that, for example, in case two data latch circuits are selected in the spare area when data read is being made in the spare area, two data latch circuits are also selected also in the main area; and thus, the two data latch circuits in the main area would be short-circuited to each other.

The word line control circuit 6 selects one of the plurality of word lines in the memory cell array 1 and applies, to the thus selected one word line (selected word line) and the other word lines (non-selected word lines), predetermined potentials corresponding to the read, program and erase modes, respectively.

The memory cell array 1, the bit line control circuits 2, the column decoder 3, the data input/output buffer and the word line control circuit 6 are controlled by a control signal and control voltage generation circuit 7.

Further, in case the portion surrounded by a one-dot broken line in FIG. 24 is assumed to constitute one unit, one unit or a plurality of such units are disposed in one chip.

According to the NAND type flash EEPROM constituted as mentioned, the four data lines IOBA0, 1, IOBB0, 1, IOAT0, 1, IOBT0, 1 are provided so that either 1-bit (2-level) or 2-bit (4-level) data can be stored. Further, it can be determined by the least significant address A0 whether the data lines IOAB0, 1, IOBB0, 1 or the data lines IOAT0, 1, IOBT0, are to be used.

Further, the respective two data latch circuits adjacent to each other constitute one set; and, in case 1-bit (2-level) data is stored in one memory cell, the transmission and reception of the data is performed between the data input/output terminal 5 and the two data latch circuits in one set at the time of program and at the time of read.

On the other hand, in case of storing 2-bit (4-level) data in one memory cell, the transmission and reception of the data is effected between the data input/output terminal 5 and one data latch circuit at the time of program and at the of time of read as in the ordinary case.

These operations can be controlled by the select signals YAb0 to YAb15, YAt0 to YAt15, YBb0 to YBb15, YBt0 to YBt15, YRB, YRt, CR0y to CR7y and the data input/output buffer.

As stated above, according to the present invention, it is possible to store data of more than 2 bits (4-level) or data of 1 bit (2-level) in one memory cell.

Figure 27:
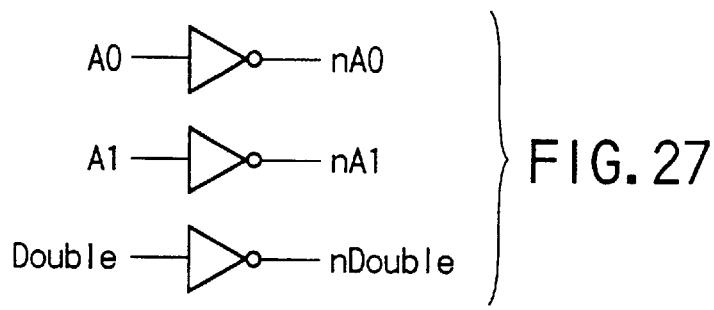
FIG. 27 is a schematic diagram showing a portion of the output route of the data input/output buffer shown in FIG. 24.
Figure 28:
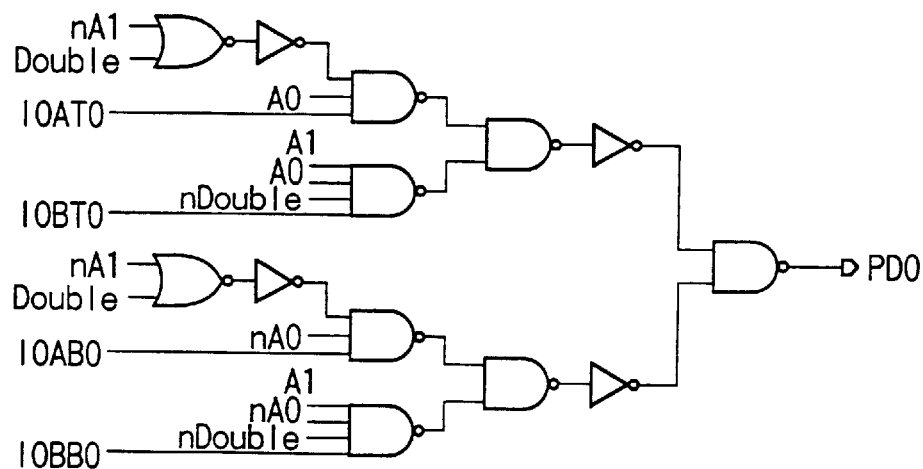
FIG. 28 is a schematic diagram showing a portion of the output route of the data input/output buffer shown in FIG. 24.
Figure 29:
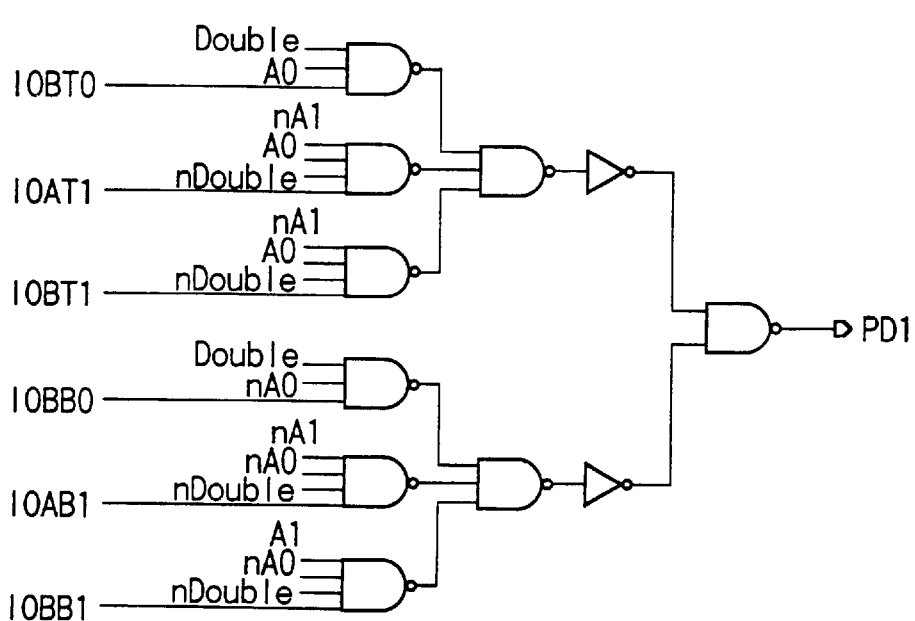
FIG. 29 is a schematic diagram showing a portion of the output route of the data input/output buffer shown in FIG. 24.
Figure 30:
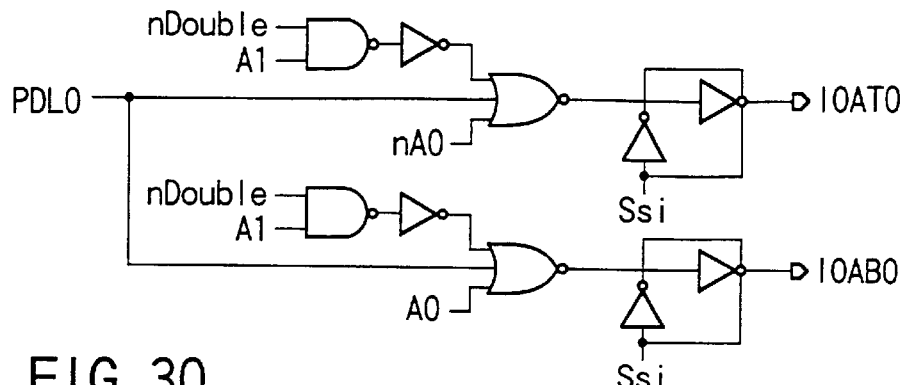
FIG. 30 is a schematic diagram showing a portion of the input route of the data input/output buffer shown in FIG. 24.
Figure 31:
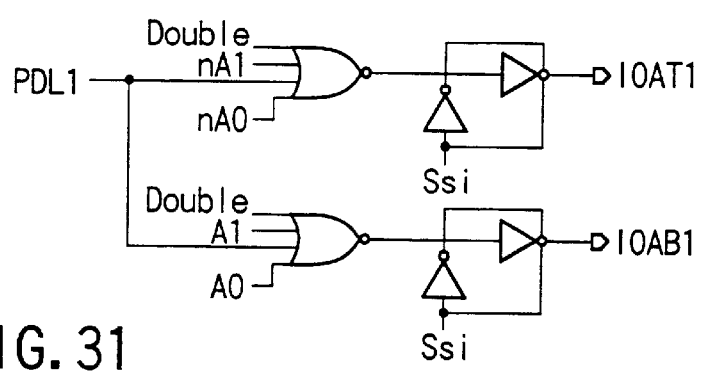
FIG. 31 is a schematic diagram showing a portion of the input route of the data input/output buffer shown in FIG. 24.
Figure 32:
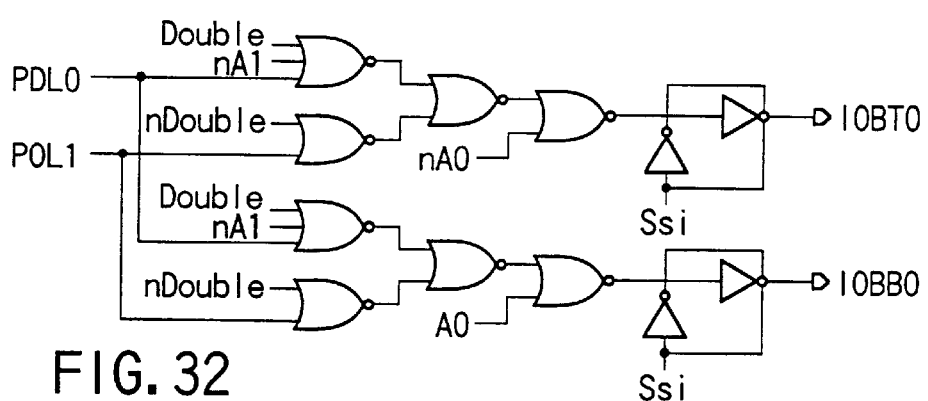
FIG. 32 is a schematic diagram showing a portion of the input route of the data input/output buffer shown in FIG. 24.
Figure 33:
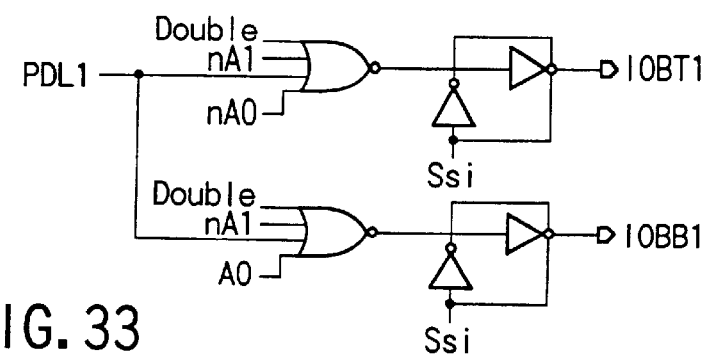
FIG. 33 is a schematic diagram showing a portion of the input route of the data input/output buffer shown in FIG. 24.

FIGS. 27 to 29 show the output route of the data in the data input/output buffer shown in FIG. 24, and FIGS. 20 to 23 show the input route of the data in the data input/output buffer shown in FIG. 24.

The operation performed by the NAND type flash EEPROM according to the second embodiment of the present invention will now be described on the basis of FIGS. 30 to 33.

(1) The description of the normal read, program, program verify, erase and erase verify operation is omitted here.

(2) 2-level to 4-level changeover operation

In a multi-level NAND flash EEPROM, the memory cell array is comprised of a main area, a spare area and a redundancy area as shown in FIG. 25 for instance. In the main area, normal bits are stored, and, in the spare area, redundant bits are stored. The redundance area is provided for relieving the defective bits in the main area or the spare area.

In this embodiment, in the memory cells of the main area, 4-level data are stored in order to increase the memory capacity, and, in the memory cells of the spare area, 2-level data are stored in order to secure the reliability even if the rewrite number becomes large.

Table 10 and Table 11 show the operation performed by the column decoder when read or program is made from or to the memory cells (4-level/cells) in the main area and the memory cells (2-level/cells) in the spare area.

TABLE 10

| A4 | A3 | A2 | A1 | YA0 | YA1 | YA2 | YA3 | YA4 | YA5 | YA6 | YA7 | YA8 | YA9 | YA10 | YA11 | YA12 | YA13 | YA14 | YA15 |
|---|---|---|---|---|---|---|---|---|---|---|---|---|---|---|---|---|---|---|---|
| L | L | L | L | H | H | | | | | | | | | | | | | | |
| L | L | L | H | H | H | | | | | | | | | | | | | | |
| L | L | H | L | | | H | H | | | | | | | | | | | | |
| L | L | H | H | | | H | H | | | | | | | | | | | | |
| L | H | L | L | | | | | H | H | | | | | | | L | | | |

TABLE 10-continued

| A4 | A3 | A2 | A1 | YA0 | YA1 | YA2 | YA3 | YA4 | YA5 | YA6 | YA7 | YA8 | YA9 | YA10 | YA11 | YA12 | YA13 | YA14 | YA15 |
|----|----|----|----|-----|-----|-----|-----|-----|-----|-----|-----|-----|-----|------|------|------|------|------|------|
| L | H | L | H |  |  |  |  | H | H |  |  |  |  |  |  |  |  |  |  |
| L | H | H | L |  |  |  |  |  |  | H | H |  |  |  |  |  |  |  |  |
| L | H | H | H |  |  |  |  |  |  | H | H |  |  |  |  |  |  |  |  |
| H | L | L | L |  |  |  |  |  |  |  |  | H | H |  |  |  |  |  |  |
| H | L | L | H |  |  |  |  |  |  |  |  | H | H |  |  |  |  |  |  |
| H | L | H | L |  |  |  |  |  |  |  |  |  |  | H | H |  |  |  |  |
| H | L | H | H |  |  |  |  |  |  |  |  |  |  | H | H |  |  |  |  |
| H | H | L | L |  |  |  |  | L |  |  |  |  |  |  |  | H | H |  |  |
| H | H | L | H |  |  |  |  |  |  |  |  |  |  |  |  | H | H |  |  |
| H | H | H | L |  |  |  |  |  |  |  |  |  |  |  |  |  |  | H | H |
| H | H | H | H |  |  |  |  |  |  |  |  |  |  |  |  |  |  | H | H |

Main area
YAi is YAbi or YAti (determined by A0)
Spare area
YAi is a YAbi or YAti (determined by A0)
YRb or YRt (determined by A0) is "H"

TABLE 11

| A8 | A7 | A6 | A5 | YB0 | YB1 | YB2 | YB3 | YB4 | YB5 | YB6 | YB7 | YB8 | YB9 | YB10 | YB11 | YB12 | YB13 | YB14 | YB15 |
|----|----|----|----|-----|-----|-----|-----|-----|-----|-----|-----|-----|-----|------|------|------|------|------|------|
| L | L | L | L | H |  |  |  |  |  |  |  |  |  |  |  |  |  |  |  |
| L | L | L | H |  | H |  |  |  |  |  |  |  |  |  |  |  |  |  |  |
| L | L | H | L |  |  | H |  |  |  |  |  |  |  |  |  |  |  |  |  |
| L | L | H | H |  |  |  | H |  |  |  |  |  |  |  |  |  |  |  |  |
| L | H | L | L |  |  |  |  | H |  |  |  |  |  | L |  |  |  |  |  |
| L | H | L | H |  |  |  |  |  | H |  |  |  |  |  |  |  |  |  |  |
| L | H | H | L |  |  |  |  |  |  | H |  |  |  |  |  |  |  |  |  |
| L | H | H | H |  |  |  |  |  |  |  | H |  |  |  |  |  |  |  |  |
| H | L | L | L |  |  |  |  |  |  |  |  | H |  |  |  |  |  |  |  |
| H | L | L | H |  |  |  |  |  |  |  |  |  | H |  |  |  |  |  |  |
| H | L | H | L |  |  |  |  |  |  |  |  |  |  | H |  |  |  |  |  |
| H | L | H | H |  |  |  |  |  |  |  |  |  |  |  | H |  |  |  |  |
| H | H | L | L |  |  |  |  | L |  |  |  |  |  |  |  | H |  |  |  |
| H | H | L | H |  |  |  |  |  |  |  |  |  |  |  |  |  | H |  |  |
| H | H | H | L |  |  |  |  |  |  |  |  |  |  |  |  |  |  | H |  |
| H | H | H | H |  |  |  |  |  |  |  |  |  |  |  |  |  |  |  | H |

Main area
YBi is YBbi or YBti (determined by A0)

In the main area, for one address (for example, A1, A2, ... A8="L, L, ... L"), two data latch circuits are selected (for example, YAb0 is "H", YAb1 is "H", and YAb0 is "H", while the others are all "L"), and, in the respective data latch circuits, 2-bit (4-level) data are latched.

In this case, the 2-bit data latched in the data latch circuit 10-0 is led to the data input/output circuit via the data lines IOAB0, IOAB1, and the data latched in the data latch circuit 10-1 is lead to the data input/output circuit via the data lines IOBB0, IOBB1.

In the data input/output circuit, the data lines IOAB0, IOAB1 or the data lines IOBB0, IOBB1 are selected, and the 2-bit data in the thus selected data lines are outputted from the two output terminals as output data PD0, PD1 (For example, when A1, A2, AB="L, L, ... L", the data lines IOAB0, IOAB1 are selected, while, when A1, A2, ... AB="H, L, ... L", the data lines IOBB0, IOBB1 are selected).

Further, the data corresponding to one page which have been simultaneously read out at the time of read are latched in the data latch circuits in the main area and serially outputted to the outside of the chip by changing the addresses A1 to A8 as shown in Table 10 and Table 11. Further, at the time of program, the addresses A1 to A8 are changed as shown in Table 10 and Table 11, whereby the data corresponding to one page is successively latched in the data latch circuits and, at the same time, the data corresponding to one page is programmed into the memory cells.

In the spare area, 1-bit (2-level) data is stored in one data latch circuit, so that, when one address (for example, A1, A2, A3, A4="L, L, L, L") is determined, the two data latch circuits are selected (for example, YAb0="H", YAb1="H", and YRb="H", while the others are all "L").

In this case, the 1-bit data latched in the data latch circuit 10-0A is led to the data input/output circuit via the data line IOAB0, while the 1-bit data latched in the data latch circuit 10-1A is led to the input/output circuit via the data line IOBB0. The data input/output circuit outputs, from the two output terminals, the respective 1-bit data of the data lines IOAB0, IOBB0 as output data PD0, PD1.

The data corresponding to one page which has been simultaneously read out at the time of read is latched in the data latch circuits in the spare area and outputted to the outside of the chip by the unit of 2 bits by changing the addresses A1 to A8 as shown in Table 10 and Table 11. Further, at the time of program, the addresses A1 to A8 are changed as shown in Table 10 and Table 11, whereby the data is transferred by the unit of 2 bits to the data latch circuits, and at the same time, the data corresponding to one page is programmed into the memory cells.

Here, according to this embodiment, portions YAb0 to YAb15, YAt0 to YAt15 of the select signals are possesses in common by the main area and the spare area, so that, when the two data latch circuits are selected in the spare area, the two data latch circuits are also selected in the main area at the same time.

Thus, in this embodiment, there are provided four data lines for connecting the data latch circuits and the data input/output buffer to each other, so that, at the time of performing data read in the spare area, the two data latch circuits in the main area are prevented from short-circuiting.

In case of storing 1-bit (2-level) data in the memory cells in the main area, the transfer of 1-bit data is effected between the data input/output buffer and the two data latch circuits at the same time. In this case, in the main area, 1-bit (2-level) data is stored in one data latch circuit, and, when one address (for example, A1, A2, . . . A8="L, L, . . . L") is determined, the two data latch circuits are selected (for example, YAb0 is "H", YAb1 is "H", and YAb0 is "H", while the others are all "L").

In the redundancy area, the same operation as in case of the main area is performs when memory cells in the main area are replaced, and the same operation as in case of the spare area is performed when memory cells in the spare area are replaced.

However, in case of replacing those memory cells of the spare area in which 2-level data is stored, the memory cells are replaced with respect to every two data latch circuits since two data latch circuits are always used as one set.

The plurality of data latch circuits in the main area, the spare area and the redundancy area are connected to the data input/output buffer through four data lines IOAB0, IOAB1, IOBB0, IOBB1 or four data lines IOAT0, IOAT1, IOBT0, IOBt1. By the address A0, either the data lines IOAB0, IOAB1, IOBB0, IOBB1 or the data lines IOAT0, IOAT1, IOBT0, IOBT1 are selected.

Even in case 2-bit (4-level) data is inputted to one data latch circuit in the main area, the two data latch circuits are selected, but, due to the existence of the four data lines IOAB0, IOAB1, IOBB0, IOBB1, only the data in one of the data latch circuits can be selected in the data input/output buffer.

In case 1-bit data (2-level) data is inputted to each of the two data latch circuits in the spare area, one of the data lines IOAB0, IOAB1 is used for the data in one data latch circuit, while, for the data in the other data latch circuit, one of the data lines IOBB0, IOBB1 is used.

As shown in FIGS. 27 to 29, the data lines IOAB0, IOAB1, IOBB0, IOBB1, IOAT0, IOAT1, IOBT0, IOBT1 are connected to the input/output buffer; for example, 2-bit data PD0, PD1 are led to two input/output terminals I/O0, I/O1 from the data input/output buffers, respectively.

Next, the operations performed at the time of read, at the time of program, at the time of program verify, and at the time of erase verify will described below.

Here, it is to be assumed that the case where the main area, the spare area or the redundancy area is used with 4-level/ cells is referred to as 4-level mode, while the main area, the spare area or the redundancy area is used with 2-level/cells is referred to as 2-level mode.

Referring to FIGS. 27 to 29 or FIGS. 30 to 33, a signal Double becomes "L" in the 4-level mode and "H" in the 2-level mode.

In case of the 4-level mode, when a read operation is performed, "11", "01", "00", "10" (See Table 23) are outputted from the data latch circuits in response to the data "0", "1", "2", "3" in the memory cells.

Next, when the column address is determined, external addresses A0x to ABx are read into registers by the circuit shown in FIG. 22 and FIG. 23 to thereby determine A0 to A8 (See Table 9).

Further, on the basis of Table 10 and Table 11, YAi, YBi, etc. are determined, and the two adjacent data latch circuits are selected. In the circuit shown in FIGS. 27 to 29, the signal Double is "L", so that the 2-bit (4-level) data in the respective data latch circuits are led to the data input/output buffer via the data lines IOAB0, IOAB1, IOBB0, IOBB1 or the data lines IOAT0, IOAT1, IOBT0, IOBT1. In the data input/output buffer, the data in one of the two data latch circuits is selected, and the thus selected 2-bit data is outputted as signals PD0, PD1 from the output terminals I/O0, I/O1.

The data in the first sub-data circuit LATCH1 is passed through the data line IOAB0 (IOAT0) or the data line IOBB0 (data line IOBT0) and outputted as signal PD0. The data in the second sub-data circuit LATCH2 is passed through the data line IOAB1 (IOAT1) or the data line IOBB1 (IOBT1) and outputted as signal PD1.

For example, when the address A1 is "L", the data in the first sub-data circuit LATCH1 is passed through the data line IOAB0 (IOAT0) and outputted as signal PD0, and, when the address A1 is "H", the data in the first sub-data circuit LATCH1 is passed through the data line IOBB0 (IOBT0) and outputted as signal PD0.

Further, when the address signal A1 is "L", the data in the second sub-data circuit LATCH2 is passed through the data line IOAB1 (IOAT1) and outputted as signal PD1, while, when the address A1 is "H", the data in the second sub-data circuit LATCH2 is passed through the data line IOBB1 (IOBT1) and outputted as signal PD1.

Selection between the data line IOAB0, IOAB1, IOBB0, IOBB1 side and the data line IOAT0, IOAT1, IOBT0, IOBT1 side is made at the address A0. In case a serial read is made without putting addresses newly, the address value is incremented in the order of A1, A2, A3, . . . with A0 as the least significant position, as shown in Table 9.

In the 2-level mode, the data in the memory cells is outputted as "11", "01" in correspondence to "0", "1". When the column address is determined, the external addresses A0x to A7x are read into the registers by the circuit shown in FIG. 22 and FIG. 23, and the addresses A0, A2 to A8 are determined (See Table 9).

Further, on the basis of Table 10 and Table 11, YAi, YBi, etc. are determined, and the two adjacent latch circuits are selected. In the circuit shown in FIGS. 27 to 29, the signal Double is "H", so that the 1-bit (2-level) data in the two data latch circuits are passed through the data lines IOAB0, IOAB1, IOBB0, IOBB1 or the data lines IOAT0, IOAT1, IOBT0, IOBT1, thus becoming signals PD0, PD1, which are then outputted from the output terminals I/O0, I/O1.

For example, the first sub-data circuit LATCH1 in one data latch circuit is connected to the data line IOAB0 (IOAT0), while the second sub-data circuit LATCH2 is connected to the data line IOAB1 (IOAT1). The first sub-data circuit LATCH1 in the other data latch circuit is connected to the data line IOBB0 (IOBT0), while the second sub-data circuit LATCH2 is connected to the data line IOBB1 (IOBT1).

Selection between the data line IOAB0, IOAB1, IOBB0, IOBB1 side and the data line IOAT0, IOAT1, IOBT0, IOBT1 side is made at the address A0. In case a serial read is effected without putting addresses newly, the address value is incremented in the order of A2, A3, . . . with A0 as the least significant position and by jumping over A1.

The program operation is executed by rendering the states of all the data latch circuits into "00", thus bringing about a state in which no program is made. After this, data corresponding to one page is put into the data latch circuits. In case of the 4-level mode when data "0", "1", "2", "3" are programmed into the memory cells, the respective data latch circuits are brought into the state of "00", "10", "11", "01" (See Table 3).

For example, as shown in FIGS. 30 to 33, program data PDL0, PDL1 is inputted from outside of the chip. A signal Ssi is normally "L" but becomes "H" when the data input mode starts. In case of the 4-level mode, the signal Double is "L", so that, when the address A1 is "L", the data PDL1 is led to the data line IOAB1 or the data line IOAT1, while the data PDL0 is led to the data line IOAB0 or the data line IOAT0.

In case the data PDL0, PDL1 are "L", the first and second sub-data circuits in the data latch circuit are brought into the state of "1". In case the data PDL0, PDL1 are "H", the states of the first and second sub-data circuits in the data latch circuit remain "0". Further, to the other data lines IOBB0, IOBB1, IOBT0, IOBT1, an "H" level potential is fed.

When the address A1 is "H", the data PDL1 is led to the data line IOBB1 or the data line IOBT1, while the data PDL0 is led to the data line IOBB0 or the data line IOBT0.

In case of the 4-level mode, when the column address is determined, YAi and YBi are determined as shown in Table 10 and Table 11, and the two data clutch circuits are selected. Further, in the data input/output buffer, one data latch circuit is selected, and, to the second sub-data circuit LATCH2, for instance, of the thus elected data latch circuit, the data PDL1 is inputted, and, to the first sub-data circuit LATCH1, the data PDL0 is inputted.

On the other hand, in case of the 2-level mode, "0" or "1" is programmed into the memory cells. Due to this, the state of the data latch circuit is rendered into "00", "10", (See Table 3).

For example, as shown in FIGS. 30 to 33, program data PDL0, PDL1 are inputted from outside of the chip. Since the signal Ssi is "H" and the operation mode is the 2-level mode, the signal Double becomes "H"; and thus, the data PDL1 is led to the data line IOBB0 or the data line IOBT0, while the data PDL0 is led to the data line IOAB0 or the data line IOAT0.

Since the mode is the 2-level mode, YAi, YAi+1 and YBi become "H" when the column address is determined, and thus, the two data latch circuits are selected. To the first sub-data circuit LATCH1 of one data latch circuit, the data PDL0 is fed, while, to the first sub-data circuit LATCH1 of the other data latch circuit, the data PDL1 is applied.

Further, the data lines IOAB1, IOAT1, IOBB1, IOBT1 are always "H" in level, so that the node Nai in the second sub-data circuit shown in FIG. 9 becomes "L" in level, and thus, the data "0" is fed. In the data input mode, OSAC becomes "L", and nOSAC becomes "H", so that the clocked inverter does not operate. Accordingly, "00" and "10" are inputted to the data latch circuit.

Program verify is performed in such a manner that, after a program operation, a read operation is performed, and, if it is decided that the threshold value of the memory cells has reached a predetermined value, then the data latch circuits are rendered into "00" (no program is made). Further, the column addresses are scanned, the data in all the data latch circuits are read out, and it is checked whether insufficiently programmed memory cells (those memory cells of which the data in the data latch circuits are "0", "11", "01") exist or not.

Here, the program verify is executed in case "10", "11", or "01" data is latched in the data latch circuits. Further, the verify read is executed three times in correspondence to the respective data "10", "11", "01", but, concerning those memory cells in which predetermined data are accurately programmed, no verify read is executed.

The data in the two data latch circuits are outputted by the use of the four data lines IOAB0, IOAB1, IOBB0, IOBB1 or the four data lines IOAT0, IOAT1, IOBT0, IOBT1, so that, in the increment in address value by means of the counter shown in FIG. 22 and FIG. 23, the 2-level mode can be employed, and thus, the scanning time can be shortened to ½.

The erase operation is carried out in the order of, for instance, the designation of the block in which erase is to be executed, erase, and verify read; examination is made as to whether the threshold value of all the memory cells is below a reference value (0V) or not, so that this operation is repeatedly carried out until no memory cell which has a threshold value exceeding the reference value (0V) comes to exist.

Erase verify is carried out in such a manner that, by the first step of this operation, verify read is executed concerning one of the two bit lines Bli, Bli+1 connected to the data latch circuits, and the result thus obtained is entered into the first sub-data circuit LATCH1. By the next step of the operation, verify read is effected concerning the other one of the two bit lines Bli, Bli+1, and the result thus obtained is fed to the second sub-data circuit LATCH2.

In case the threshold value of the memory cells is lower than the reference value (0V), the node Nai in the first or second sub-data circuit LATCH1, LATCH2 becomes "0", and thus, "0" data is latched. If the threshold value of the memory cells exceeds the threshold value (0V), then the node Nai in the first or second sub-data circuit LATCHI, LATCH2 becomes "1", and thus, "1" data is latched. The result thus obtained is read out by scan.

In case of erase verify, the data in the two data latch circuits are outputted by the use of the four data lines IOAB0, IOAB1, IOBB0, IOBB1 or the four data lines IOAT0, IOAT1, IOBT0, IOBT1 as in case of the program verify, so that the increment in address value performed by the counter shown in FIG. 22 and FIG. 23 can employ the 2-level mode; and thus, the scanning time can be shortened to ½.

In case of performing a test operation, three operations READ01, READ10, READ00 (Reference is made to the first embodiment) are carried out separately, whereby it is confirmed whether or not the respective operations are normal.

For making it possible to perform program and program verify up to the maximum loop count in an auto program operation, it is sufficient to render the data in all the memory cells to PASS ("0"), to make setting so as to execute them until the maximum loop count is reached, or to compulsorily render the flag of verify to a fail (FAIL) state. Further, it is possible to employ the concept of "maximum loop count" also at the time of test to thereby perform a stress test. This performance or efficiency can also be applied to auto erase.

As has been described above, the non-volatile semiconductor memory according to the present invention has the 2-level mode according to which 1-bit (2-level) data is stored in one memory cell and a multi-level (such as, e.g., 4-level) mode according to which 2-bit (4-level) or more multi-bit (multi-level) data is stored in one memory cell, so that, in the 2-level mode and in the multi-level mode, the number of the data latch circuits selected is made to differ with reference to the transmission and reception of data between the data input/output buffer and the data latch circuits; that is, in case of the multi-level mode, one data latch circuit is selected as in case of an ordinary multi-level NAND EEPROM, while, in case of the 2-level mode, a plurality of data latch circuits are selected. Thus, according to the present invention, it is possible to store 1-bit (2-level) data or multi-bit (multi-level) data in one non-volatile semiconductor memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory, comprising:
   a first data latch circuit having a first sub data circuit locating one side and a second sub data circuit locating another side;
   first and second bit lines connecting to the first data latch circuit;
   a second data latch circuit having a third sub data circuit locating the one side and a fourth sub data circuit locating the another side;
   third and fourth bit lines connecting to the second data latch circuit;
   a first data line connecting to the first and third sub data circuits;
   a second data line connecting to the second sub data circuit; and
   a third data line connecting to the fourth sub data circuit.

2. The nonvolatile semiconductor memory according to claim 1, wherein the first and second sub data circuits latch multi-bits when a memory cell stores multi-bits.

3. The nonvolatile semiconductor memory according to claim 1, wherein the third and fourth sub data circuits latch multi-bits when a memory cell stores multi-bits.

4. The nonvolatile semiconductor memory according to claim 1, wherein each of the second and fourth sub data circuits latches one bit and each of the first and third sub data circuits latches no data when a memory cell stores one bit.

5. The nonvolatile semiconductor memory according to claim 1, wherein the first and second data latch circuits locate in a main area, a memory cell in the main area storing multi-bits.

6. The nonvolatile semiconductor memory according to claim 1, wherein the first and second data latch circuits locate in a spare area, a memory cell in the spare area storing one bit.

7. The nonvolatile semiconductor memory according to claim 1, wherein the first and second data latch circuits locate in a redundancy area, a memory cell in the redundancy area storing multi-bits or one bit.

8. The nonvolatile semiconductor memory according to claim 1, wherein the first and second data lines transfer multi-bits when a memory cell stores multi-bits.

9. The nonvolatile semiconductor memory according to claim 1, wherein the first and third data lines transfer multi-bits when a memory cell stores multi-bits.

10. The nonvolatile semiconductor memory according to claim 1, wherein each of the second and third data lines transfers one bit when a memory cell stores one bit.

11. A nonvolatile semiconductor memory, comprising:
    a first data latch circuit having a first sub data circuit locating one side and a second sub data circuit locating another side;
    first and second bit lines connecting to the first data latch circuit;
    a second data latch circuit having a third sub data circuit locating the one side and a fourth sub data circuit locating the another side;
    third and fourth bit lines connecting to the second data latch circuit;
    a first data line connecting to the first sub data circuit;
    a second data line connecting to the second sub data circuit;
    a third data line connecting to the third sub data circuit; and
    a fourth data line connecting to the fourth sub data circuit.

12. The nonvolatile semiconductor memory according to claim 11, wherein the first and second sub data circuits latch multi-bits when a memory cell stores multi-bits.

13. The nonvolatile semiconductor memory according to claim 11, wherein the third and fourth sub data circuits latch multi-bits when a memory cell stores multi-bits.

14. The nonvolatile semiconductor memory according to claim 11, wherein each of the first and third sub data circuits latches one bit and each of the second and fourth sub data circuits latches no data when a memory cell stores one bit.

15. The nonvolatile semiconductor memory according to claim 11, wherein each of the second and fourth sub data circuits latches one bit and each of the first and third sub data circuits latches no data when a memory cell stores one bit.

16. The nonvolatile semiconductor memory according to claim 11, wherein the first and second data latch circuits locate in a main area, a memory cell in the main area storing multi-bits.

17. The nonvolatile semiconductor memory according to claim 11, wherein the first and second data latch circuits locate in a spare area, a memory cell in the spare area storing one bit.

18. The nonvolatile semiconductor memory according to claim 11, wherein the first and second data latch circuits locate in a redundancy area, a memory cell in the redundancy area storing multi-bits or one bit.

19. The nonvolatile semiconductor memory according to claim 11, wherein the first and second data lines transfer multi-bits when a memory cell stores multi-bits.

20. The nonvolatile semiconductor memory according to clam 11, wherein the third and fourth data lines transfer multi-bits when a memory cell stores multi-bits.

21. The nonvolatile semiconductor memory according to claim 11, wherein one of the first and second data lines transfers one bit when a memory cell stores one bit, and one of the third and fourth data lines transfers one bit when the memory cell stores one bit.

* * * * *